(12) United States Patent
Larson, III

(10) Patent No.: US 7,852,644 B2
(45) Date of Patent: Dec. 14, 2010

(54) AC-DC POWER CONVERTER

(75) Inventor: John D. Larson, III, Palo Alto, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 12/272,742

(22) Filed: Nov. 17, 2008

(65) Prior Publication Data

US 2009/0073730 A1 Mar. 19, 2009

Related U.S. Application Data

(62) Division of application No. 11/263,874, filed on Oct. 31, 2005, now Pat. No. 7,463,499.

(51) Int. Cl.
*H02M 7/08* (2006.01)
*H02M 7/06* (2006.01)
(52) U.S. Cl. .............................. 363/69; 363/3
(58) Field of Classification Search ............. 363/65, 363/67, 68, 69, 70, 125, 126, 1, 2, 3, 4
See application file for complete search history.

(56) References Cited

U.S. PATENT DOCUMENTS

| | | |
|---|---|---|
| 3,174,122 A | 3/1965 | Fowler et al. |
| 3,189,851 A | 6/1965 | Fowler |
| 3,321,648 A | 5/1967 | Kolm |
| 3,422,371 A | 1/1969 | Poirier et al. |
| 3,568,108 A | 3/1971 | Poirier et al. |
| 3,582,839 A | 6/1971 | Pim et al. |
| 3,590,287 A | 6/1971 | Berlincourt et al. |
| 3,610,969 A | 10/1971 | Clawson et al. |
| 3,826,931 A | 7/1974 | Hammond |
| 3,845,402 A | 10/1974 | Nupp |
| 4,084,217 A | 4/1978 | Brandli et al. |
| 4,172,277 A | 10/1979 | Pinson |
| 4,272,742 A | 6/1981 | Lewis |
| 4,281,299 A | 7/1981 | Newbold |
| 4,320,365 A | 3/1982 | Black et al. |
| 4,355,408 A | 10/1982 | Scarrott |
| 4,456,850 A | 6/1984 | Inoue et al. |
| 4,529,904 A | 7/1985 | Hattersley |
| 4,608,541 A | 8/1986 | Moriwaki et al. |

(Continued)

FOREIGN PATENT DOCUMENTS

DE 10160617 6/2003

(Continued)

OTHER PUBLICATIONS

U.S. Appl. No. 10/971,169, filed Oct. 22, 2004, Larson III, John D., et al.

(Continued)

*Primary Examiner*—Gary L Laxton

(57) ABSTRACT

An AC-DC power converter is composed of AC input, a first rectifying circuit, a second rectifying circuit, a DC-DC converter and a DC output. The DC-DC converter has a DC input. The first rectifying circuit and the second rectifying circuit are connected in parallel between the AC input and the DC input of the DC-DC converter. At least one of the rectifying circuits comprises a phase shifting element that provides a phase shift at the AC line frequency.

1 Claim, 8 Drawing Sheets

U.S. PATENT DOCUMENTS

| | | | |
|---|---|---|---|
| 4,625,138 A | 11/1986 | Ballato | |
| 4,640,756 A | 2/1987 | Wang et al. | |
| 4,719,383 A | 1/1988 | Wang et al. | |
| 4,798,990 A | 1/1989 | Henoch | |
| 4,819,215 A | 4/1989 | Yokoyama et al. | |
| 4,836,882 A | 6/1989 | Ballato | |
| 4,841,429 A | 6/1989 | McClanahan et al. | |
| 4,906,840 A | 3/1990 | Zdeblick et al. | |
| 5,048,036 A | 9/1991 | Scifres et al. | |
| 5,048,038 A | 9/1991 | Brennan et al. | |
| 5,066,925 A | 11/1991 | Freitag | |
| 5,075,641 A | 12/1991 | Weber et al. | |
| 5,111,157 A | 5/1992 | Komiak | |
| 5,118,982 A | 6/1992 | Inoue et al. | |
| 5,129,132 A | 7/1992 | Zdeblick et al. | |
| 5,162,691 A | 11/1992 | Mariani et al. | |
| 5,214,392 A | 5/1993 | Kobayashi et al. | |
| 5,233,259 A | 8/1993 | Krishnaswamy et al. | |
| 5,241,209 A | 8/1993 | Sasaki | |
| 5,241,456 A | 8/1993 | Marcinkiewicz et al. | |
| 5,270,492 A | 12/1993 | Fukui | |
| 5,294,898 A | 3/1994 | Dworsky et al. | |
| 5,329,200 A | 7/1994 | Zaitsu | |
| 5,361,077 A | 11/1994 | Weber | |
| 5,382,930 A | 1/1995 | Stokes et al. | |
| 5,384,808 A | 1/1995 | Van Brunt et al. | |
| 5,448,014 A | 9/1995 | Kong et al. | |
| 5,465,725 A | 11/1995 | Seyed-Boloforosh | |
| 5,475,351 A | 12/1995 | Uematsu | |
| 5,548,189 A | 8/1996 | Williams | |
| 5,587,620 A | 12/1996 | Ruby et al. | |
| 5,589,858 A | 12/1996 | Kadowaki et al. | |
| 5,594,705 A | 1/1997 | Connor et al. | |
| 5,633,574 A | 5/1997 | Sage | |
| 5,671,242 A | 9/1997 | Takiguchi et al. | |
| 5,692,279 A | 12/1997 | Mang et al. | |
| 5,705,877 A | 1/1998 | Shimada | |
| 5,714,917 A | 2/1998 | Ella | |
| 5,789,845 A | 8/1998 | Wadaka et al. | |
| 5,828,562 A | 10/1998 | Rivet | |
| 5,831,846 A | 11/1998 | Jiang | |
| 5,853,601 A | 12/1998 | Krishaswamy et al. | |
| 5,864,261 A | 1/1999 | Weber | |
| 5,866,969 A | 2/1999 | Shimada et al. | |
| 5,872,493 A | 2/1999 | Ella | |
| 5,873,153 A | 2/1999 | Ruby et al. | |
| 5,873,154 A | 2/1999 | Ylilammi et al. | |
| 5,894,184 A | 4/1999 | Furuhashi et al. | |
| 5,894,647 A | 4/1999 | Lakin | |
| 5,910,756 A | 6/1999 | Ella | |
| 5,932,953 A | 8/1999 | Drees et al. | |
| 5,936,150 A | 8/1999 | Kobrin et al. | |
| 5,953,479 A | 9/1999 | Zhou et al. | |
| 5,955,926 A | 9/1999 | Uda et al. | |
| 5,962,787 A | 10/1999 | Okada et al. | |
| 5,969,463 A | 10/1999 | Tomita | |
| 5,969,954 A | 10/1999 | Zaitsu | |
| 5,982,297 A | 11/1999 | Welle | |
| 6,001,664 A | 12/1999 | Swirhun et al. | |
| 6,016,052 A | 1/2000 | Vaughn | |
| 6,040,962 A | 3/2000 | Kanazawa et al. | |
| 6,060,818 A | 5/2000 | Ruby et al. | |
| 6,087,198 A | 7/2000 | Panasik | |
| 6,107,721 A | 8/2000 | Lakin | |
| 6,111,341 A | 8/2000 | Hirama | |
| 6,111,480 A | 8/2000 | Iyama et al. | |
| 6,124,678 A | 9/2000 | Bishop et al. | |
| 6,124,756 A | 9/2000 | Yaklin et al. | |
| 6,131,256 A | 10/2000 | Dydyk | |
| 6,150,703 A | 11/2000 | Cushman et al. | |
| 6,187,513 B1 | 2/2001 | Katakura | |
| 6,215,375 B1 | 4/2001 | Larson, III et al. | |
| 6,219,263 B1 | 4/2001 | Wuidart | |
| 6,228,675 B1 | 5/2001 | Ruby et al. | |
| 6,229,247 B1 | 5/2001 | Bishop | |
| 6,252,229 B1 | 6/2001 | Hays et al. | |
| 6,262,600 B1 | 7/2001 | Haigh et al. | |
| 6,262,637 B1 | 7/2001 | Bradley et al. | |
| 6,263,735 B1 | 7/2001 | Nakatani et al. | |
| 6,265,246 B1 | 7/2001 | Ruby et al. | |
| 6,278,342 B1 | 8/2001 | Ella | |
| 6,292,336 B1 | 9/2001 | Horng et al. | |
| 6,307,447 B1 | 10/2001 | Barber et al. | |
| 6,307,761 B1 | 10/2001 | Nakagawa | |
| 6,335,548 B1 | 1/2002 | Roberts et al. | |
| 6,355,498 B1 | 3/2002 | Chan et al. | |
| 6,366,006 B1 | 4/2002 | Boyd | |
| 6,376,280 B1 | 4/2002 | Ruby et al. | |
| 6,377,137 B1 | 4/2002 | Ruby | |
| 6,384,697 B1 | 5/2002 | Ruby | |
| 6,396,200 B2 | 5/2002 | Misu et al. | |
| 6,407,649 B1 | 6/2002 | Tikka et al. | |
| 6,414,569 B1 | 7/2002 | Nakafuku | |
| 6,420,820 B1 | 7/2002 | Larson, III | |
| 6,424,237 B1 | 7/2002 | Ruby et al. | |
| 6,429,511 B2 | 8/2002 | Ruby et al. | |
| 6,434,030 B1 | 8/2002 | Rehm et al. | |
| 6,437,482 B1 | 8/2002 | Shibata | |
| 6,441,539 B1 | 8/2002 | Kitamura et al. | |
| 6,441,702 B1 | 8/2002 | Ella et al. | |
| 6,462,631 B2 | 10/2002 | Bradley et al. | |
| 6,466,105 B1 | 10/2002 | Lobl et al. | |
| 6,466,418 B1 | 10/2002 | Horng et al. | |
| 6,469,597 B2 | 10/2002 | Ruby et al. | |
| 6,472,954 B1 | 10/2002 | Ruby et al. | |
| 6,476,536 B1 | 11/2002 | Pensala | |
| 6,479,320 B1 | 11/2002 | Gooch | |
| 6,483,229 B2 | 11/2002 | Larson, III et al. | |
| 6,486,751 B1 | 11/2002 | Barber et al. | |
| 6,489,688 B1 | 12/2002 | Baumann et al. | |
| 6,492,883 B2 | 12/2002 | Liang et al. | |
| 6,496,085 B2 | 12/2002 | Ella et al. | |
| 6,507,983 B1 | 1/2003 | Ruby et al. | |
| 6,515,558 B1 | 2/2003 | Ylilammi | |
| 6,518,860 B2 | 2/2003 | Ella et al. | |
| 6,525,996 B1 | 2/2003 | Miyazawa | |
| 6,530,515 B1 | 3/2003 | Glenn et al. | |
| 6,534,900 B2 | 3/2003 | Aigner et al. | |
| 6,542,055 B1 | 4/2003 | Frank et al. | |
| 6,548,942 B1 | 4/2003 | Panaski | |
| 6,548,943 B2 | 4/2003 | Kaitila et al. | |
| 6,550,664 B2 | 4/2003 | Bradley et al. | |
| 6,559,487 B1 | 5/2003 | Kang et al. | |
| 6,564,448 B1 | 5/2003 | Oura et al. | |
| 6,566,956 B2 | 5/2003 | Ohnishi et al. | |
| 6,566,979 B2 | 5/2003 | Larson, III et al. | |
| 6,583,374 B2 | 6/2003 | Knieser et al. | |
| 6,583,688 B2 | 6/2003 | Klee et al. | |
| 6,593,870 B2 | 7/2003 | Dummermuth et al. | |
| 6,594,165 B2 | 7/2003 | Duerbaum et al. | |
| 6,600,390 B2 | 7/2003 | Frank | |
| 6,601,276 B2 | 8/2003 | Barber | |
| 6,617,249 B2 | 9/2003 | Ruby et al. | |
| 6,617,750 B2 | 9/2003 | Dummermuth et al. | |
| 6,630,753 B2 | 10/2003 | Malik et al. | |
| 6,635,509 B1 | 10/2003 | Ouellet | |
| 6,639,872 B1 | 10/2003 | Rein | |
| 6,651,488 B2 | 11/2003 | Larson, III et al. | |
| 6,657,363 B1 | 12/2003 | Aigner | |
| 6,668,618 B2 | 12/2003 | Larson, III et al. | |
| 6,670,866 B2 | 12/2003 | Ella et al. | |
| 6,693,500 B2 | 2/2004 | Yang et al. | |
| 6,710,508 B2 | 3/2004 | Ruby et al. | |
| 6,710,681 B2 | 3/2004 | Figueredo et al. | |

| | | |
|---|---|---|
| 6,714,102 B2 | 3/2004 | Ruby et al. |
| 6,720,844 B1 | 4/2004 | Lakin |
| 6,720,846 B2 | 4/2004 | Iwashita et al. |
| 6,724,266 B2 | 4/2004 | Plazza et al. |
| 6,738,267 B1 | 5/2004 | Navas Sabater et al. |
| 6,774,746 B2 | 8/2004 | Whatmore et al. |
| 6,777,263 B1 | 8/2004 | Gan et al. |
| 6,787,048 B2 | 9/2004 | Bradley et al. |
| 6,788,170 B1 | 9/2004 | Kaitila et al. |
| 6,803,835 B2 | 10/2004 | Frank |
| 6,812,619 B1 | 11/2004 | Kaitila et al. |
| 6,828,713 B2 | 12/2004 | Bradley et al. |
| 6,842,088 B2 | 1/2005 | Yamada et al. |
| 6,842,089 B2 | 1/2005 | Lee |
| 6,873,065 B2 | 3/2005 | Haigh et al. |
| 6,873,529 B2 | 3/2005 | Ikuta |
| 6,874,211 B2 | 4/2005 | Bradley et al. |
| 6,874,212 B2 | 4/2005 | Larson, III |
| 6,888,424 B2 | 5/2005 | Takeuchi et al. |
| 6,900,705 B2 | 5/2005 | Nakamura et al. |
| 6,903,452 B2 | 6/2005 | Ma et al. |
| 6,906,451 B2 | 6/2005 | Yamada et al. |
| 6,911,708 B2 | 6/2005 | Park |
| 6,917,261 B2 | 7/2005 | Unterberger |
| 6,924,583 B2 | 8/2005 | Lin et al. |
| 6,924,717 B2 | 8/2005 | Ginsburg et al. |
| 6,927,651 B2 | 8/2005 | Larson, III et al. |
| 6,936,928 B2 | 8/2005 | Hedler et al. |
| 6,936,954 B2 | 8/2005 | Peczalski |
| 6,943,648 B2 | 9/2005 | Maiz et al. |
| 6,946,928 B2 | 9/2005 | Larson et al. |
| 6,954,121 B2 | 10/2005 | Bradley et al. |
| 6,963,257 B2 | 11/2005 | Ella et al. |
| 6,970,365 B2 | 11/2005 | Turchi |
| 6,975,183 B2 | 12/2005 | Aigner et al. |
| 6,977,563 B2 | 12/2005 | Komuro et al. |
| 6,985,052 B2 | 1/2006 | Tikka |
| 6,987,433 B2 | 1/2006 | Larson et al. |
| 6,989,723 B2 | 1/2006 | Komuro et al. |
| 6,998,940 B2 | 2/2006 | Metzger |
| 7,019,604 B2 | 3/2006 | Gotoh et al. |
| 7,019,605 B2 | 3/2006 | Larson, III et al. |
| 7,026,876 B1 | 4/2006 | Esfandiari et al. |
| 7,057,476 B2 | 6/2006 | Hwu |
| 7,064,606 B2 | 6/2006 | Louis |
| 7,084,553 B2 | 8/2006 | Ludwiczak |
| 7,091,649 B2 | 8/2006 | Larson, III et al. |
| 7,098,758 B2 | 8/2006 | Wang et al. |
| 7,128,941 B2 | 10/2006 | Lee |
| 7,138,889 B2 | 11/2006 | Lakin |
| 7,161,448 B2 | 1/2007 | Feng et al. |
| 7,170,215 B2 | 1/2007 | Namba et al. |
| 7,173,504 B2 | 2/2007 | Larson |
| 7,187,254 B2 | 3/2007 | Su et al. |
| 7,209,374 B2 | 4/2007 | Noro |
| 7,230,509 B2 | 6/2007 | Stoemmer |
| 7,230,511 B2 | 6/2007 | Onishi et al. |
| 7,259,498 B2 | 8/2007 | Nakatsuka et al. |
| 7,281,304 B2 | 10/2007 | Kim et al. |
| 7,310,861 B2 | 12/2007 | Aigner et al. |
| 7,332,985 B2 | 2/2008 | Laqrson et al. |
| 7,367,095 B2 | 5/2008 | Larson, III et al. |
| 7,369,013 B2 | 5/2008 | Fazzio et al. |
| 7,388,318 B2 | 6/2008 | Yamada et al. |
| 7,388,454 B2 | 6/2008 | Ruby et al. |
| 7,388,455 B2 | 6/2008 | Larson, III |
| 7,408,428 B2 | 8/2008 | Larson, III |
| 7,414,349 B2 | 8/2008 | Sasaki |
| 7,425,787 B2 | 9/2008 | Larson, III |
| 7,439,824 B2 | 10/2008 | Aigner |
| 2002/0000646 A1 | 1/2002 | Gooch et al. |
| 2002/0030424 A1 | 3/2002 | Iwata |
| 2002/0063497 A1 | 5/2002 | Panasik |

| | | | |
|---|---|---|---|
| 2002/0121944 A1 | 9/2002 | Larson, III et al. | |
| 2002/0121945 A1 | 9/2002 | Ruby et al. | |
| 2002/0126517 A1 * | 9/2002 | Matsukawa et al. | ........... 363/69 |
| 2002/0152803 A1 | 10/2002 | Larson, III et al. | |
| 2002/0190814 A1 | 12/2002 | Yamada et al. | |
| 2003/0001251 A1 | 1/2003 | Cheever et al. | |
| 2003/0006502 A1 | 1/2003 | Karpman | |
| 2003/0051550 A1 | 3/2003 | Nguyen et al. | |
| 2003/0087469 A1 | 5/2003 | Ma | |
| 2003/0102776 A1 | 6/2003 | Takeda et al. | |
| 2003/0111439 A1 | 6/2003 | Fetter et al. | |
| 2003/0128081 A1 | 7/2003 | Ella et al. | |
| 2003/0132493 A1 | 7/2003 | Kang et al. | |
| 2003/0141946 A1 | 7/2003 | Ruby et al. | |
| 2003/0179053 A1 | 9/2003 | Aigner et al. | |
| 2004/0016995 A1 | 1/2004 | Kuo et al. | |
| 2004/0092234 A1 | 5/2004 | Pohjonen | |
| 2004/0124952 A1 | 7/2004 | Tikka | |
| 2004/0150293 A1 | 8/2004 | Unterberger | |
| 2004/0150296 A1 | 8/2004 | Park et al. | |
| 2004/0195937 A1 | 10/2004 | Matsubara et al. | |
| 2004/0212458 A1 | 10/2004 | Lee | |
| 2004/0257171 A1 | 12/2004 | Park et al. | |
| 2004/0257172 A1 | 12/2004 | Schmidhammer et al. | |
| 2004/0263287 A1 | 12/2004 | Ginsburg et al. | |
| 2005/0012570 A1 | 1/2005 | Korden et al. | |
| 2005/0023931 A1 | 2/2005 | Bouche et al. | |
| 2005/0030126 A1 | 2/2005 | Inoue et al. | |
| 2005/0036604 A1 | 2/2005 | Scott et al. | |
| 2005/0057117 A1 | 3/2005 | Nakatsuka et al. | |
| 2005/0057324 A1 | 3/2005 | Onishi et al. | |
| 2005/0068124 A1 | 3/2005 | Stoemmer | |
| 2005/0093396 A1 | 5/2005 | Larson, III et al. | |
| 2005/0093653 A1 | 5/2005 | Larson, III | |
| 2005/0093654 A1 | 5/2005 | Larson, III et al. | |
| 2005/0093655 A1 | 5/2005 | Larson, III et al. | |
| 2005/0093657 A1 | 5/2005 | Larson, III et al. | |
| 2005/0093658 A1 | 5/2005 | Larson, III et al. | |
| 2005/0093659 A1 | 5/2005 | Larson, III et al. | |
| 2005/0104690 A1 | 5/2005 | Larson | |
| 2005/0110598 A1 | 5/2005 | Larson, III | |
| 2005/0128030 A1 | 6/2005 | Larson, III et al. | |
| 2005/0140466 A1 | 6/2005 | Larson, III et al. | |
| 2005/0167795 A1 | 8/2005 | Higashi | |
| 2005/0193507 A1 | 9/2005 | Ludwiczak | |
| 2005/0206271 A1 | 9/2005 | Higuchi et al. | |
| 2005/0218488 A1 | 10/2005 | Matsuo | |
| 2006/0081048 A1 | 4/2006 | Mikado et al. | |
| 2006/0087199 A1 | 4/2006 | Larson, III et al. | |
| 2006/0103492 A1 | 5/2006 | Feng et al. | |
| 2006/0125489 A1 | 6/2006 | Feucht et al. | |
| 2006/0132262 A1 | 6/2006 | Fazzio et al. | |
| 2006/0164183 A1 | 7/2006 | Tikka | |
| 2006/0185139 A1 | 8/2006 | Larson, III et al. | |
| 2006/0197411 A1 | 9/2006 | Hoen et al. | |
| 2006/0238070 A1 | 10/2006 | Costa et al. | |
| 2007/0085447 A1 | 4/2007 | Larson, III | |
| 2007/0085631 A1 | 4/2007 | Larson, III et al. | |
| 2007/0085632 A1 | 4/2007 | Larson, III et al. | |
| 2007/0086080 A1 | 4/2007 | Larson, III et al. | |
| 2007/0086274 A1 | 4/2007 | Nishimura et al. | |
| 2007/0090892 A1 | 4/2007 | Larson, III | |
| 2007/0170815 A1 | 7/2007 | Unkrich | |
| 2007/0171002 A1 | 7/2007 | Unkrich | |

FOREIGN PATENT DOCUMENTS

| | | |
|---|---|---|
| EP | 231892 | 8/1987 |
| EP | 637875 | 2/1995 |
| EP | 0637875 | 2/1995 |
| EP | 689254 | 12/1995 |
| EP | 0231892 | 8/1997 |
| EP | 0865157 | 9/1998 |

| | | |
|---|---|---|
| EP | 880227 | 11/1998 |
| EP | 973256 | 1/2000 |
| EP | 1047189 | 10/2000 |
| EP | 1096259 | 5/2001 |
| EP | 1100196 | 5/2001 |
| EP | 1180494 | 2/2002 |
| EP | 1249932 | 10/2002 |
| EP | 1258989 | 11/2002 |
| EP | 1258990 | 11/2002 |
| EP | 1517443 | 3/2005 |
| EP | 1517444 | 3/2005 |
| EP | 1528674 | 5/2005 |
| EP | 1528675 | 5/2005 |
| EP | 1528676 | 5/2005 |
| EP | 1528677 | 5/2005 |
| EP | 1542362 | 6/2005 |
| EP | 1557945 | 7/2005 |
| EP | 1575165 | 9/2005 |
| GB | 1207974 | 10/1970 |
| GB | 2013343 | 8/1979 |
| GB | 2411239 | 8/2005 |
| GB | 2418791 | 4/2006 |
| GB | 2427773 | 1/2007 |
| JP | 61054686 | 3/1986 |
| JP | 2002/217676 | 8/2002 |
| WO | WO-98/16957 | 4/1998 |
| WO | WO-01/06647 | 1/2001 |
| WO | WO-01/99276 | 12/2001 |
| WO | WO-02/103900 | 12/2002 |
| WO | WO-03/030358 | 4/2003 |
| WO | WO-03/043188 | 5/2003 |
| WO | WO-03/050950 | 6/2003 |
| WO | WO-03/058809 | 7/2003 |
| WO | WO-2004/034579 | 4/2004 |
| WO | WO-2004/051744 | 6/2004 |
| WO | WO-2004/102688 | 11/2004 |
| WO | WO-2005/043752 | 5/2005 |
| WO | WO-2005/043753 | 5/2005 |
| WO | WO-2005/043756 | 5/2005 |
| WO | WO-2006/018788 | 2/2006 |

OTHER PUBLICATIONS

Aoyama, Takayuki et al., "Diffusion of Boron, Phosphorous, Arsenic and Antimony in Thermally Grown SiliconDioxide", *Journal of the Electrochemical Society*, vol. 146, No. 5 1999, 1879-1883.

Auld, B. A., "Acoustic Resonators", *Acoustic Fields and Waves in Solids, Second Edition*, vol. II 1990, 250-259.

Bauer, L. O. et al., "Properties of Silicon Implanted with Boron Ions through Thermal Silicon Dioxide", *Solid State Electronics*, vol. 16, No. 3 Mar. 1973, 289-300.

Choi, Sunjin et al., "Design of Half-Bridge Piezo-Transformer Converters in the AC Adapter Applications", *IEEE 2005*, 244-248.

Coombs, Clyde F., "Electronic Instrument Handbook", *Second Edition, McGraw-Hill, Inc.* 1995, pp. 5.1 to 5.29.

Fattinger, G. G. et al., "Coupled Bulk Acoustic Wave Resonator Filters: Key technology for single-to-balanced RF filters", 0-7803-8331-1/4/W20.00; *IEEE MTT-S Digest* 2004, 927-929.

Hadimioglu, B. et al., ""Polymer Films As Acoustic Matching Layers".", *1990 IEEE Ultrasonics Symposium Proceedings*, vol. 3 pp. [Previously submitted as "Polymer Files As Acoustic Matching Layers, 1990 IEEE Ultrasonics Symposium Proceeding. vol. 4 pp. 1227-1340, Dec. 1990". Considered by Examiner on Mar. 20, 2007 Dec. 1990, 1337-1340.

Hara, K., "Surface Treatment of Quartz Oscillator Plate by Ion Implantation", *Oyo Buturi*, vol. 47, No. 2 Feb. 1978, 145-146.

Holzlohner, Ronald et al., "Accurate Calculation of Eye Diagrams and Bit Error Rates in Optical Transmission Systems Using Linearization", *Journal of Lightwave Technology*, vol. 20, No. 3, Mar. 2002, pp. 389-400.

Ivensky, Gregory et al., "A Comparison of Piezoelectric Transformer AC/DC Converters with Current Doubler and voltage Doubler Rectifiers", *IEEE Transactions on Power Electronics*, vol. 19, No. 6. Nov. 2004.

Jiang, Yimin et al., "A Novel Single-Phase Power Factor Correction Scheme", *IEEE* 1993, 287-292.

Jung, Jun-Phil et al., "Experimental And Theoretical Investigation On The Relationship Between AlN Properties and AlN-Based FBAR Characteristics", *2003 IEEE International Frequency Control Symposium and PDA Exhibition Jointly with the 17th European Frequency and Time Forum* Sep. 3, 2003, 779-784.

Krishnaswamy, S.V. et al., "Film Bulk Acoustic Wave Resonator Technology", May 29, 1990, 529-536.

Lakin, K.M., "Bulk Acoustic Wave Coupled Resonator Filters", *2002 IEEE International Frequency Control Symposium and PDA Exhibition* Jan. 2, 2002, 8-14.

Lakin, K.M., "Coupled Resonator Filters", *2002 IEEE Ultrasonics Symposium* Mar. 2, 2002, 901-908.

Lakin, K.M. et al., "High Performance Stacked Crystal Filters for GPS and Wide Bandwidth Applications", *2001 IEEE Ultrasonics Symposium* Jan. 1, 2001, 833-838.

Lakin, K. M. et al., "Temperature Compensated Bulk Acoustic Thin Film Resonators", *IEEE Ultrasonics Symposium*, San Juan, Puerto Rico Oct. 2000, 855-858.

Lakin, K. M., "Thin Film Resonators and Filters", *IEEE Untrasonics Symposium*, Caesar's Tahoe, NV Oct. 1999, 895-906.

Larson III, John D. et al., "Measurement of Effective Kt2,Q,Rp,Rs vs. Temperature for Mo/AlN FBAR Resonators", *IEEE Ultrasonics Symposium* 2002, 939-943.

Li, Yunxiu et al., "AC-DC Converter with Worldwide Range Input Voltage by Series and Parallel Piezoelectric Transformer Connection", *35th Annual IEEE Power Electronics Specialists Conference* 2004.

Lobl, H.P. et al., "Piezoelectric Materials for BAW Resonators And Filters", *2001 IEEE Ultrasonics Symposium* Jan. 1, 2001, 807-811.

Martin, Steven J. et al., "Development Of A Low Dielectric Constant Polymer For The Fabrication Of Integrated Circuit Interconnect", *12 Advanced Materials* Dec. 23, 2000, 1769-1778.

Navas, J. et al., "Miniaturised Battery Charger using Piezoelectric Transformers", *IEEE* 2001, 492-496.

Ng, J. et al., "The Diffusion Ion-Implanted Boron in Silicon Dioxide", *AIP Conf. Proceedings*, No. 122 1984, 20-33.

Ohta, S. et al., "Temperature Characteristics of Solidly Mounted Piezoelectric Thin Film Resonators", *IEEE Ultrasonics Symposium*, Honolulu, HI Oct. 2003, 2011-2015.

Pang, W. et al., "High Q Single-Mode High-Tone Bulk Acoustic Resonator Integrated With Surface-Machined FBAR Filter", *Microwave Symposium Digest, IEEE MTT-S International* 2005, 413-416.

Parker, T. E. et al., "Temperature-Compensated Surface Acoustic-Wave Devices with SiO2 Film Overlays", *J. Appl. Physics*, vol. 50 1360-1369, Mar. 1979.

Reinhardt, Alexandre et al., "Design of Coupled Resonator Filters Using Admittance and Scattering Matrices", *2003 IEEE Ultrasonics Symposium* May 3, 2003, 1428-1431.

Ruby, R. C., "MicroMachined Thin Film Bulk Acoustic Resonators", *IEEE International Frequency Control Symposium* 1994, 135-138.

Ruby, R. et al., "The Effect of Perimeter Geometry on FBAR Resonator Electrical Performance", *Microwave Symposium Digest, 2005 IEEE MTT-S International* Jun. 12, 2005, 217-221.

Sanchez, A.M. et al., "Mixed analytical and numerical design method for piezoelectric transformers", *IEEE,PESX* Jun. 2003, 841-846.

Schuessler, Hans H., "Ceramic Filters and Resonators", *Reprinted from IEEE Trans. Sonics Ultrason.*, vol. SU-21 Oct. 1974, 257-268.

Spangenberg, B. et al., "Dependence of the Layer Resistance of Boron Implantation in Silicon and the Annealing Conditions", *Comptus Rendus de l'Academic Bulgare des Sciences*, vol. 33, No. 3 1980, 325-327.

Tiersten, H. F. et al., "An Analysis of Thiskness-Extensional Trapped Energy Resonant Device Structures with Rectangular Electrodes in the Piezoelectric Thin Film on Silicon Configuration", *J. Appl. Phys.* 54 (10) Oct. 1983, 5893-5910.

Topich, J. A. et al., "Effects of Ion Implanted Flourine in Silicon Dioxide", *Nuclear Instr. And Methods, Cecon Rec, Cleveland, OH* May 1978, 70-73.

Tsubbouchi, K. et al., "Zero Temperature coefficient Surface Acoustic Wave Devices using Epitaxial AlN Films", *IEEE Ultrasonic symposium*, San Diaego, CA, 1082 1982, 240-245.

Vasic, D et al., "A new MOSFET & IGBT Gate Drive Insulated by a Piezoelectric Transformer", *IEEE 32 nd Annual Power Electronics SPecialists Conference*, 2001 vol. 3 Jun. 17-21,03, 1479-1484.

Vasic, D et al., "A New Mothod to Design Piezoelectic Transformer Uned to MOSFET & IGBT Drive Circuits", *IEEE 34th ANuual Power Electronics Specialists Conference*, 2003 vol. 1 Jun. 15-19, 03, 307-312.

Yang, C.M. et al., "Highly C Axis Oriented AlN Film Using MOCVD For 5GHx Band FBAR Filter", *2003 IEEE Ultrasonics Symposium* Oct. 5, 2003, pp. 170-173.

\* cited by examiner

… (US 7,852,644 B2)

AC-DC POWER CONVERTER

BACKGROUND

Most electronic devices are powered by an AC-DC power supply that receives alternating current (AC) power from an AC line at a nominal voltage in the range from 100 volts to 240 volts RMS and a frequency of 50 Hz or 60 Hz and supplies direct current (DC) power at one or more voltages in a range from about 1 volt to 50 volts. Conventionally, a magnetically-coupled transformer whose primary is connected to the AC line is used to step the AC line voltage down to the voltage needed by the electronic device. The output of the transformer is rectified, filtered with a large capacitor to remove the ripple component and regulated to provide the DC power for the electronic device. Problems with this solution include the large size and weight of the transformer, the large physical size of the ~0.1 Farad capacitor used to filter the ripple component, and the inherent one-off type process used to fabricate the power supply. The large size and weight of the transformer and the large size of the capacitor are the result of the low frequency of the AC line.

The physical size and weight of the power supply can be reduced by rectifying the AC line voltage, filtering the resulting raw DC, chopping the filtered DC at a frequency typically of the order of tens of kilohertz, and using a transformer to step the voltage of the chopped DC down to the voltage needed by the electronic device. The output of the transformer is then rectified, filtered and regulated. With this solution, the transformer and the second filter capacitor are smaller than the transformer and filter capacitor in the previous example because they operate at a much higher frequency. However, the first filter capacitor is still large because it operates at the AC line frequency. Moreover, a one-off type process is needed to fabricate at least part of such switching-mode power supply.

DETAILED DESCRIPTION

Figure 1:
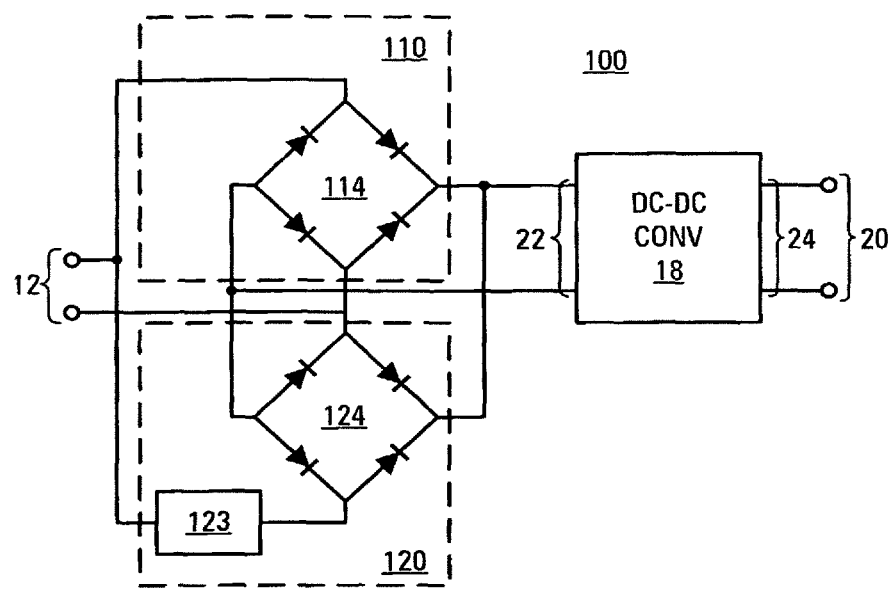
FIG. 1 is a block diagram of an example of an AC-DC power converter in accordance with a first embodiment of the invention.

FIG. 1 is a block diagram of an example of an AC-DC power converter 100 in accordance with a first embodiment of the invention. AC-DC power converter 100 is composed of AC input 12, a first rectifying circuit 110, a second rectifying circuit 120, a DC-DC converter 18 and a DC output 20. DC-DC converter has a DC input 22 and a DC output 24. First rectifying circuit 110 and second rectifying circuit 120 are connected in parallel between AC input 12 and the DC input 22 of DC-DC converter 18. At least one of the rectifying circuits comprises a phase shifting element that provides a phase shift at the AC line frequency. In this first embodiment, second rectifying circuit 120 comprises a phase shifting element 123.

First rectifying circuit 110 and second rectifying circuit 120 deliver high-voltage raw DC to the DC input 22 of DC-DC converter 18. DC-DC converter 18 converts the high-voltage raw DC provided by first rectifying circuit 110 and second rectifying circuit 120 to smooth DC at a lower voltage and delivers the smooth, lower voltage DC to DC output 20. The electronic device (not shown) powered by AC-DC power converter 100 is connected to DC output 20. DC-DC converter 18 additionally provides galvanic isolation between AC input 12 and DC output 20 at voltage differences typically in the range from about 1 kV to 4 kV.

DC-DC converter 18 has a minimum input voltage. The voltage across the DC input 22 of the DC-DC converter falling below the minimum input voltage of causes undesirable periodic dips in the DC voltage delivered by the DC-DC converter to DC output 20. Accordingly, the minimum voltage provided to DC input 22 under maximum load conditions should remain greater than the minimum input voltage of DC-DC converter 18.

In the embodiment shown in FIG. 1, first rectifying circuit 110 is composed of a bridge rectifier 114 having inputs connected to AC input 12 and outputs connected to the DC input 22 of DC-DC converter 18. Second rectifying circuit 120 is composed of phase shifting element 123 and a bridge rectifier 124 connected between AC input 12 and the DC input 22 of DC-DC converter 18. More specifically, phase shifting element 123 is connected between AC input 12 and one input of bridge rectifier 124, and the outputs of bridge rectifier 124 are connected to the DC input 22 of DC-DC converter 18. In this embodiment, in second rectifying circuit 120, phase shifting element 123 is embodied as an inductor that imposes a phase lag on the AC current fed from AC input 12 to bridge rectifier 124.

Figure 2A:
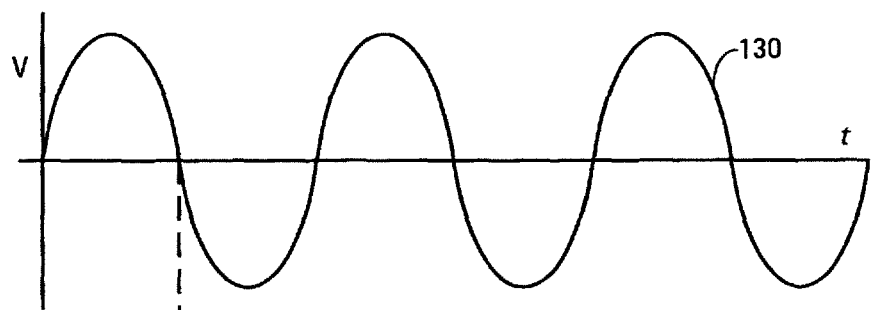
FIGS. 2A, 2B, 2C and 2D are graphs showing the waveforms of the AC line voltage, the output voltage of first rectifying circuit, the output voltage of second rectifying circuit, and the voltage across the DC input of the DC-DC converter in the example of an AC-DC power converter shown in FIG. 1.

FIG. 2A is a graph showing the waveform 130 of the AC line voltage received at AC input 12. The AC line voltage has a nominal frequency of 50 Hz or 60 Hz and a nominal RMS voltage in the range from 100 volts to 240 volts.

Figure 2B:
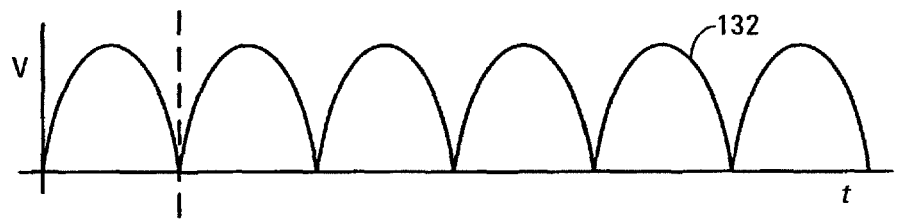

FIG. 2B is a graph showing the waveform 132 of the output voltage of first rectifying circuit 110. The output voltage of the first rectifying circuit has a frequency equal to twice the AC line frequency and a nominal peak voltage in the range from about 140 volts to about 340 volts, depending on the nominal AC line voltage. The output voltage of the first rectifying circuit is substantially in phase with the AC line voltage.

Figure 2C:
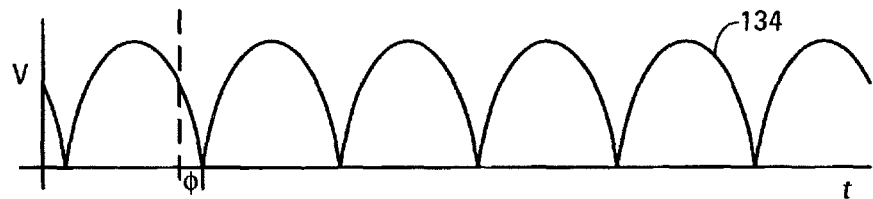

FIG. 2C is a graph showing the waveform 134 of the output voltage of second rectifying circuit 120. The output voltage of the second rectifying circuit has a frequency equal to twice the AC line frequency and a nominal peak voltage in the range from about 140 volts to about 340 volts, depending on the nominal AC line voltage. Due to phase shifting element 123, the output voltage of second rectifying circuit 120 is shifted in phase relative to the AC line voltage and, hence, relative to the output voltage of first rectifying circuit 110. In the example shown, phase shifting element 123 introduces a lag, so that the output voltage of rectifying circuit 120 lags the AC line voltage and that of first rectifying circuit 110 by a phase shift φ, as shown in FIG. 2C.

Figure 2D:
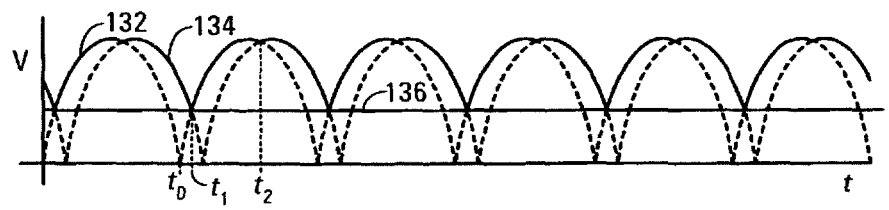

FIG. 2D is a graph showing the waveform of the voltage across the DC input 22 of DC-DC converter 18. The waveform is a superposition of above-described waveforms 132 and 134 that differ in phase by a phase shift φ. Operation of AC-DC power converter 100 will be described starting at a time $t_0$, which is one of the times at which the output voltage of first rectifying circuit 110 is zero. At time $t_0$, the voltage output by first rectifying circuit 110 is less than the voltage output by second rectifying circuit 120 due to the phase lag in the voltage output of the second rectifying circuit. Thus, second rectifying circuit 120 is the sole supplier of current to DC-DC converter 18: the diodes of first rectifying circuit 110 are reverse biased. As time advances from time $t_0$, the output voltage of first rectifying circuit 110 increases as the output of second rectifier circuit 120 falls. At a time $t_1$, the output voltage of first rectifying circuit 110 becomes greater than that of second rectifying circuit 120, and first rectifying circuit 110 takes over as the sole supplier of current to DC-DC converter 18. The diodes of second rectifying circuit 120 are reverse biased. The output voltage of first rectifying circuit 110 continues to increase to a peak value, then begins to fall as the output voltage of second rectifying circuit 120 rises. At a time $t_2$, the output voltage of first rectifying circuit 110 falls below that of second rectifying circuit 120, and second rectifying circuit 120 once more becomes the sole supplier of current to DC-DC converter 18. The process just described then repeats every half cycle of the AC line voltage, with the task of sole supplier of current to DC-DC converter 18 alternating between first rectifying circuit 110 and second rectifying circuit 120 at times $t_1$ and $t_2$.

In FIG. 2D, solid lines are used to indicate the portion of the output voltage waveform 132 of first rectifying circuit 110 and the portion of the voltage waveform 134 of second rectifying circuit 120 during which the respective rectifying circuit is supplying current to DC-DC converter 18. Additionally, in FIG. 2D, broken lines are used to indicate the portion of the output voltage waveform 132 of first rectifying circuit 110 and the portion of the voltage waveform 134 of second rectifying circuit 120 during which the respective rectifying circuit is not supplying current to DC-DC converter 18.

FIG. 2D illustrates how the voltage across DC input 22 never falls below the minimum voltage level indicated by the line 136: second rectifying circuit 120 provides to DC-DC converter 18 a voltage greater than minimum voltage level 136 during the time that the output voltage of first rectifying circuit is below minimum voltage level 136 and vice versa. Minimum voltage level 136 depends on the phase shift provided by phase shifting element 123. Phase shifting element 123 is specified such that the phase shift it provides is sufficient to ensure that minimum voltage level 136 is greater than or equal to the minimum input voltage of DC-DC converter 18 at its maximum output current. This will be described below in more detail. First rectifying circuit 110 and second rectifying circuit 120 collectively maintain the voltage at the DC input 22 of DC-DC converter 18 above the minimum input voltage of DC-DC converter 18. This prevents undesirable periodic dips in the DC voltage delivered to DC output 20.

In a practical example in which the AC line voltage and frequency are 120V and 60 Hz, respectively, and the minimum input voltage of DC-DC converter 18 is 10 V, the peak output voltage of first rectifying circuit 110 and second rectifying circuit 120 is about 120√2 volts, i.e., about 170 V. The period corresponding to the AC line frequency of 60 Hz is 16.7 milliseconds (ms). This means that the output voltage of each of the first rectifying circuit and the second rectifying circuit falls to zero every 8.3 ms. The time τ during which the output of each of the first rectifying circuit and the second rectifying circuit falls below the minimum input voltage of the DC-DC converter is given by:

$$\tau = 2*(8.3 \text{ ms}/180 \text{ degrees})*\arcsin(10/170)$$

$$= 0.31 \text{ ms}.$$

Thus, the output voltage of first rectifying circuit 110 falls below the minimum input voltage of DC-DC converter 18 for a time 0.31 ms every half cycle of the AC line voltage. This time will be referred to as the dead time of first rectifying circuit 110. However, the output voltage of second rectifying circuit falls to zero later than that of first rectifying circuit 110 due to the phase lag between the output voltage of the first rectifying circuit and the output voltage second rectifying circuit. The phase lag is determined by phase shifting element 123. Phase shifting element 123 is specified such that the output voltage of the second rectifying circuit remains greater than the minimum input voltage of DC-DC converter 18 during the dead time (i.e., 0.31 ms in this example). This allows the voltage across the DC input 22 of DC-DC converter 18 to remain above the minimum input voltage of DC-DC converter 18 without the need for an energy storage element, such as a large capacitance, high working voltage electrolytic capacitor.

In an example in which DC-DC converter 18 has an input impedance equivalent to 1 ohm, i.e., DC-DC converter 18 draws about ten amperes from first rectifying circuit 110 and second rectifying circuit 120, phase shifting element 123 is designed to provide a phase shift of 6.6 degrees with an effective load resistance of 1 ohm, i.e., phase shifting element 123 is an inductor with a reactance of j*0.058 ohms. An inductor of about 380 microhenries (µH) has this reactance at 60 Hz.

Phase shifting element 123 may alternatively constitute part of first rectifying circuit 110. In such an embodiment, phase shifting element 123 is connected between AC input 12 and one input of bridge rectifier 114, and second rectifying circuit 120 comprises no phase shifting element.

Figure 3:
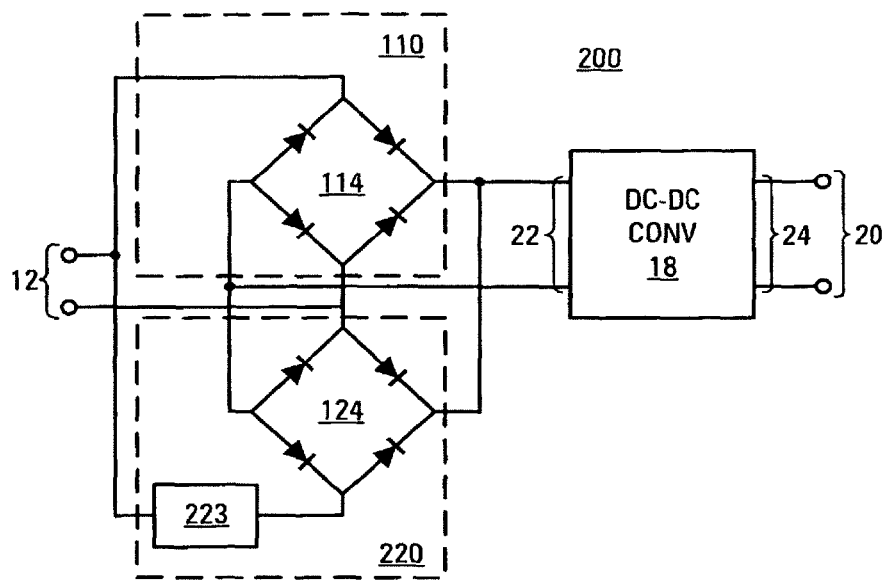
FIG. 3 is a block diagram of an example of an AC-DC power converter in accordance with a second embodiment of the invention.

FIG. 3 is a block diagram of an example of an AC-DC power converter 200 in accordance with a second embodiment of the invention. AC-DC power converter 200 is composed of AC input 12, first rectifying circuit 110, a second rectifying circuit 220, DC-DC converter 18 and DC output 20. First rectifying circuit 110 and second rectifying circuit 220 are connected in parallel between AC input 12 and the DC input 22 of DC-DC converter 18. At least one of the rectifying circuits comprises a phase shifting element providing a phase shift at the AC line frequency. In this second embodiment, second rectifying circuit 120 comprises a phase shifting element 223.

In the embodiment shown in FIG. 3, second rectifying circuit 220 is composed of phase shifting element 223 and bridge rectifier 124 connected between AC input 12 and the DC input 22 of DC-DC converter 18. More specifically, phase shifting element 223 is connected between AC input 12 and one input of bridge rectifier 124, and the outputs of bridge rectifier 124 are connected to the DC input 22 of DC-DC converter 18. In this embodiment, in second rectifying circuit 220, phase shifting element 223 is embodied as a capacitor that imposes a phase lead on the AC current fed to bridge rectifier 124.

Figure 4A:
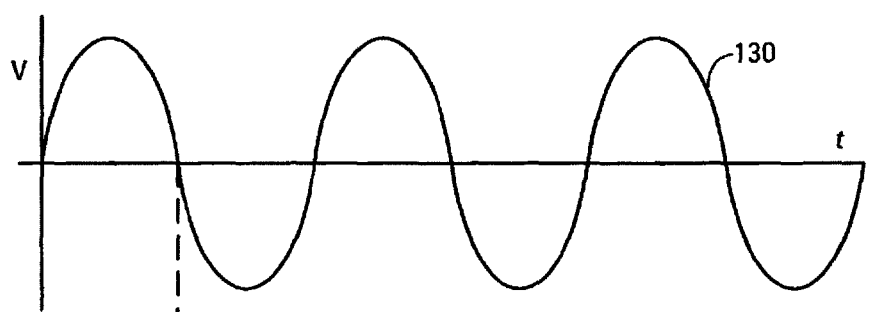
FIGS. 4A, 4B, 4C and 4D are graphs showing the waveforms of the AC line voltage, the output voltage of first rectifying circuit, the output voltage of second rectifying circuit, and the voltage across the DC input of the DC-DC converter in the example of an AC-DC power converter shown in FIG. 3.

FIG. 4A is a graph showing the waveform 130 of the AC line voltage received at AC input 12. The AC line voltage has a nominal frequency of 50 Hz or 60 Hz and a nominal RMS voltage in the range from 100 volts to 240 volts.

Figure 4B:
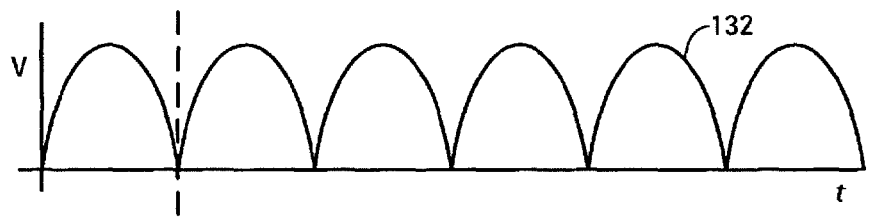

FIG. 4B is a graph showing the waveform 132 of the output voltage of first rectifying circuit 110. The output voltage has a frequency equal to twice the AC line frequency and a nominal peak voltage in the range from about 140 volts to 340 volts, depending on the nominal AC line voltage. The output voltage of first rectifying circuit 110 is substantially in phase with the AC line voltage.

Figure 4C:
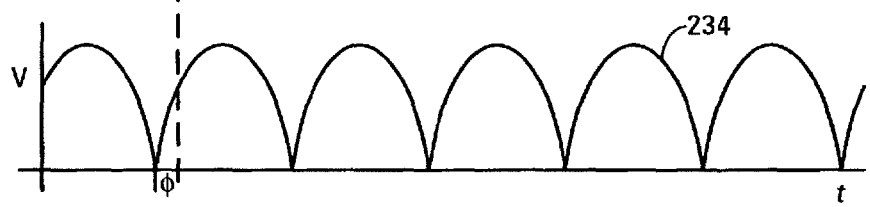

FIG. 4C is a graph showing the waveform 234 of the output voltage of second rectifying circuit 220. The output voltage of the second rectifying circuit has a frequency equal to twice the AC line frequency and a nominal peak voltage in the range from about 140 volts to 340 volts, depending on the nominal AC line voltage. Due to phase shifting element 223, the output voltage of second rectifying circuit 220 is shifted in phase relative to the AC line voltage and, hence, relative to the output voltage of first rectifying circuit 110. In the example shown, phase shifting element 223 introduces a phase lead, so that the output voltage of second rectifying circuit 220 leads the AC line voltage and the output voltage of first rectifying circuit 110 by a phase shift of $\phi$, as shown in FIG. 4C.

Figure 4D:
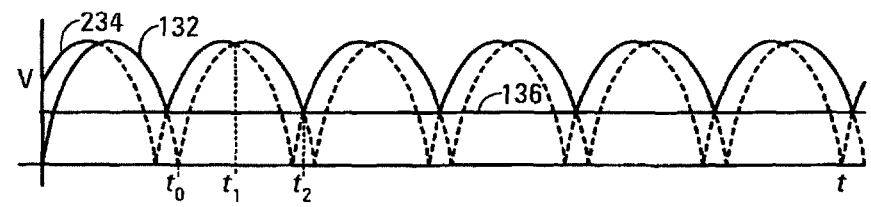

FIG. 4D is a graph showing the waveform of the voltage across the DC input 22 of DC-DC converter 18. Operation of AC-DC power converter 200 will be described starting at a time $t_0$, which is one of the times at which the output voltage of first rectifying circuit 110 is zero. At time to, the output voltage of second rectifying circuit 220 is greater than the output voltage of first rectifying circuit 110 due to the phase lead in the output voltage of the second rectifying circuit. Thus, second rectifying circuit 220 is the sole supplier of current to DC-DC converter 18: the diodes of first rectifying circuit 110 are reverse biased. As time advances from time $t_0$, the output voltage of second rectifying circuit 220 increases to its peak and then falls followed by the increasing and then falling output voltage of first rectifying circuit 110. At time $t_1$, the output voltage of second rectifying circuit 220 falls below that of first rectifying circuit 110, and first rectifying circuit 110 becomes the sole supplier of current to DC-DC converter 18. The diodes of second rectifying circuit 220 are reverse biased. Later, the output voltage of second rectifying circuit 220 falls to zero, and then starts to rise. During this time, the output voltage of first rectifying circuit 110 remains greater than or equal to minimum voltage level 136. Eventually, at time $t_2$, the output voltage of second rectifying circuit 220 once more exceeds the output voltage of first rectifying circuit 110, and second rectifying circuit takes over once more as the sole supplier of current to DC-DC converter 18. The diodes of first rectifying circuit 110 are reverse biased. The process just described then repeats every half cycle of the AC line voltage, with first rectifying circuit 110 and second rectifying circuit 220 alternating at times $t_1$ and $t_2$ as the sole supplier of current to DC-DC converter 18.

In FIG. 4D, solid lines are used to indicate the portion of the output voltage waveform 132 of first rectifying circuit 110 and the portion of the voltage waveform 234 of second rectifying circuit 220 during which the respective rectifying circuit is supplying current to DC-DC converter 18. Additionally, in FIG. 4D, broken lines are used to indicate the portion of the output voltage waveform 132 of first rectifying circuit 110 and the portion of the voltage waveform 234 of second rectifying circuit 220 during which the respective rectifying circuit is not supplying current to DC-DC converter 18.

FIG. 4D illustrates how the voltage across DC input 22 never falls below the minimum voltage level indicated by the line 136: first rectifying circuit 110 provides to DC-DC converter 18 a voltage greater than minimum voltage level 136 during the time that the output voltage of second rectifying circuit 220 is below minimum voltage level 136 and vice versa. Minimum voltage level 136 depends on the phase shift provided by phase shifting element 223. Phase shifting element 223 is specified such that the phase shift it provides is sufficient to ensure that minimum voltage level 136 is greater than or equal to the minimum input voltage of DC-DC converter 18 at its maximum output current. First rectifying circuit 110 and second rectifying circuit 220 collectively maintain the voltage at the DC input 22 of DC-DC converter 18 above the minimum input voltage of DC-DC converter 18. This prevents undesirable periodic dips in the DC voltage delivered to DC output 20.

In an example similar to that described above but in which the phase shifting element is a capacitor, a capacitance of about 33 millifarads (33 mF) has the above-stated reactance of $-j*0.058$ ohms. The maximum voltage across the capacitor is small, so the capacitor need have only a small working voltage.

Phase shifting element 223 may alternatively constitute part of first rectifying circuit 110. In such an embodiment, phase shifting element 223 is connected between AC input 12 and one input of bridge rectifier 114, and second rectifying circuit 220 comprises no phase shifting element.

Figure 5:
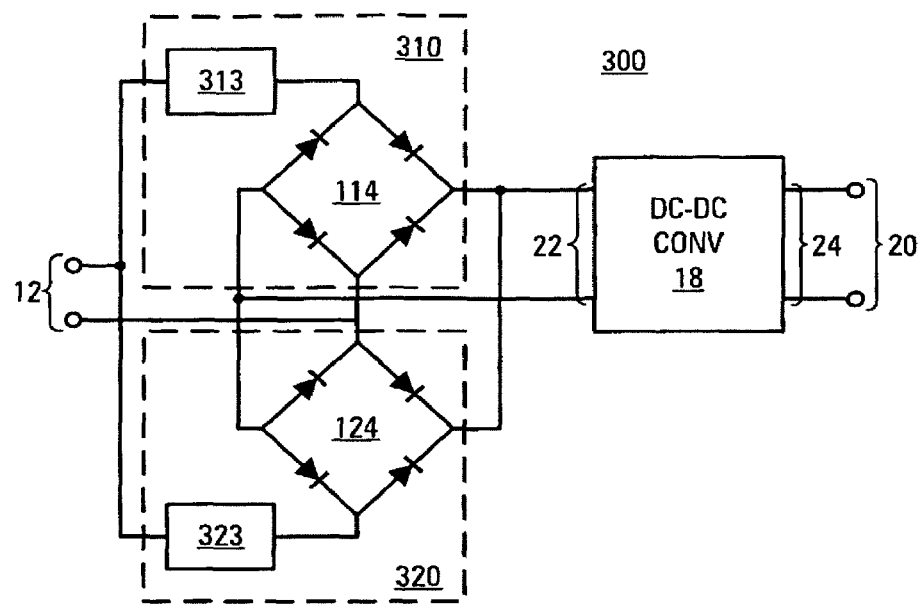
FIG. 5 is a block diagram of an example of an AC-DC power converter in accordance with a third embodiment of the invention.

FIG. 5 is a block diagram of an example of an AC-DC power converter 300 in accordance with a third embodiment of the invention. AC-DC power converter 300 is composed of AC input 12, a first rectifying circuit 310, a second rectifying circuit 320, DC-DC converter 18 and DC output 20. First rectifying circuit 310 and second rectifying circuit 320 are connected in parallel between AC input 12 and the DC input 22 of DC-DC converter 18. Rectifying circuits 310 and 320 each comprise a phase shifting element providing a phase shift at the AC line frequency. In this third embodiment, first rectifying circuit 310 comprises a phase shifting element 313 and second rectifying circuit 320 comprises a phase shifting element 323. Phase shifting elements 313 and 323 provide opposite and substantially equal phase shifts.

In the embodiment shown in FIG. 5, first rectifying circuit 310 is composed of phase shifting element 313 and bridge rectifier 114 connected between AC input 12 and the DC input 22 of DC-DC converter 18. More specifically, phase shifting element 313 is connected between AC input 12 and one input of bridge rectifier 114, and the outputs of bridge rectifier 114 are connected to the DC input 22 of DC-DC converter 18. Second rectifying circuit 320 is composed of phase shifting element 323 and bridge rectifier 124 connected between AC input 12 and the DC input 22 of DC-DC converter 18. More specifically, phase shifting element 323 is connected between AC input 12 and one input of bridge rectifier 124, and the outputs of bridge rectifier 124 are connected to the DC input 22 of DC-DC converter 18. In this embodiment, in first rectifying circuit 310, phase shifting element 313 is embodied as a capacitor that imposes a phase lead on the AC current fed from AC input 12 to bridge rectifier 114 and, in second rectifying circuit 320, phase shifting element 323 is embodied as an inductor that imposes a phase lag on the AC current fed from AC input 12 to bridge rectifier 124.

Figure 6A:
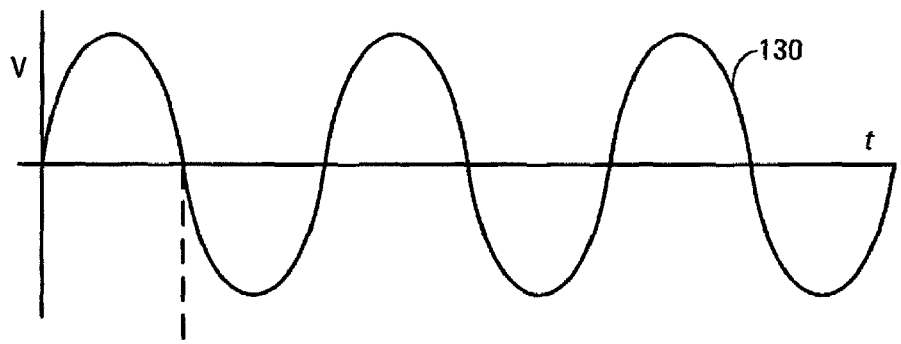
FIGS. 6A, 6B, 6C and 6D are graphs showing the waveforms of the AC line voltage, the output voltage of first rectifying circuit, the output voltage of second rectifying circuit, and the voltage across the DC input of the DC-DC converter in the example of an AC-DC power converter shown in FIG. 5.

FIG. 6A is a graph showing the waveform 130 of the AC line voltage received at AC input 12. The AC line voltage has a nominal frequency of 50 Hz or 60 Hz and a nominal RMS voltage in the range from 100 volts to 240 volts.

Figure 6B:
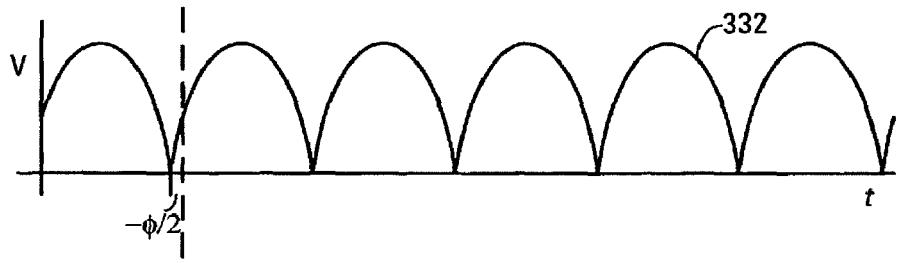

FIG. 6B is a graph showing the waveform 332 of the output voltage of first rectifying circuit 110. The output voltage of the first rectifying circuit has a frequency equal to twice the AC line frequency and a nominal peak voltage in the range from about 140 volts to about 340 volts, depending on the nominal AC line voltage. Due to phase shifting element 313, the output voltage of first rectifying circuit 110 is shifted in phase relative to the AC line voltage. In the example shown, phase shifting element 313 introduces a phase lead, so that the output voltage of first rectifying circuit 310 leads the AC line voltage by a phase shift $\phi/2$, as shown in FIG. 6B.

Figure 6C:
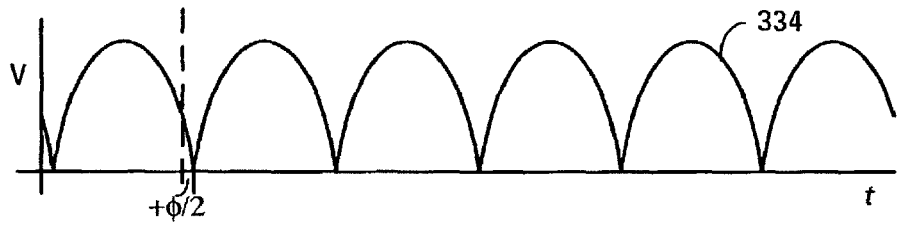

FIG. 6C is a graph showing the waveform 334 of the output voltage of second rectifying circuit 320. The output voltage of the second rectifying circuit has a frequency equal to twice the AC line frequency and a nominal peak voltage in the range from about 140 volts to about 340 volts, depending on the nominal AC line voltage. Due to phase shifting element 323, the output voltage of second rectifying circuit 320 is shifted in phase relative to the AC line voltage. In the example shown, phase shifting element 323 introduces a phase lag, so that the output voltage of rectifying circuit 320 lags that of the AC line voltage by a phase shift $\phi/2$, as shown in FIG. 6C.

Figure 6D:
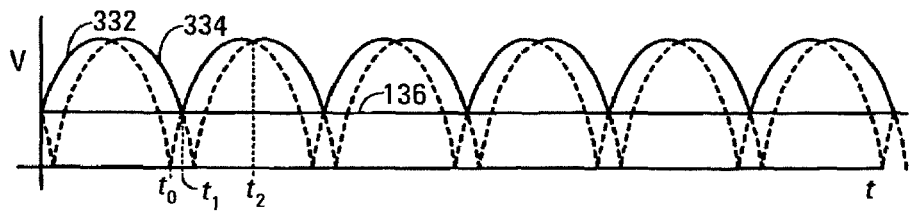

FIG. 6D is a graph showing the waveform of the voltage across the DC input 22 of DC-DC converter 18. The waveform is a superposition of above-described waveforms 332 and 334 that differ in phase by a phase shift $\phi$. Operation of AC-DC power converter 300 will be described starting at a time $t_0$, which is one of the times at which the output voltage of first rectifying circuit 310 is zero. At time $t_0$, the output voltage of first rectifying circuit 310 is less than the output voltage of second rectifying circuit 320 due to the phase lag between the output voltage of the second rectifying circuit and that of the first rectifying circuit. Thus, second rectifying circuit 320 is the sole supplier of current to DC-DC converter 18: the diodes of first rectifying circuit 310 are reverse biased. As time advances from time $t_0$, the output voltage of first rectifying circuit 310 increases as the output of second rectifying circuit 320 falls. At time $t_1$, the output voltage of first rectifying circuit 310 becomes greater than that of second rectifying circuit 320, and first rectifying circuit 310 takes over as the sole supplier of current to DC-DC converter 18. The diodes of second rectifying circuit 320 are reverse biased. The output voltage of first rectifying circuit 310 continues to increase to a peak value, then begins to fall as the output voltage of second rectifying circuit 320 continues to rise. At time $t_2$, the output voltage of first rectifying circuit 310 falls below that of second rectifying circuit 320, and second rectifying circuit 320 once more becomes the sole supplier of current to DC-DC converter 18. The process just described then repeats every half cycle of the AC line voltage, with first rectifying circuit 310 and second rectifying circuit 320 alternating at times $t_1$ and $t_2$ as the sole supplier of current to DC-DC converter 18.

In FIG. 6D, solid lines are used to indicate the portion of the output voltage waveform 332 of first rectifying circuit 310 and the portion of the voltage waveform 334 of second rectifying circuit 320 during which the respective rectifying circuit is supplying current to DC-DC converter 18. Additionally, in FIG. 6D, broken lines are used to indicate the portion of the output voltage waveform 332 of first rectifying circuit 310 and the portion of the voltage waveform 334 of second rectifying circuit 320 during which the respective rectifying circuit is not supplying current to DC-DC converter 18.

FIG. 6D illustrates how the voltage across DC input 22 never falls below the minimum voltage level indicated by the line 136: second rectifying circuit 320 provides to DC-DC converter 18 a voltage greater than minimum voltage level 136 during the time that the output voltage of first rectifying circuit 310 is below minimum voltage level 136 and vice versa. Minimum voltage level 136 depends on the phase shift between the output voltages of first rectifying circuit 310 and second rectifying circuit 320 collectively provided by phase shifting element 313 and phase shifting element 323. Phase shifting elements 313 and 323 are specified such that the phase shift they collectively provide is sufficient to ensure that minimum voltage level 136 is greater than or equal to the minimum input voltage of DC-DC converter 18 at its maximum output current. First rectifying circuit 310 and second rectifying circuit 320 collectively maintain the voltage at the DC input 22 of DC-DC converter 18 above the minimum input voltage of DC-DC converter 18. This prevents undesirable periodic dips in the DC voltage that DC-DC converter 18 delivers to DC output 20.

In an example similar to that described above but in which phase shifting element 313 is a capacitor and phase shifting element 323 is an inductor, each phase shifting element provides approximately one half of the total phase shift between the output voltages of first rectifying circuit 310 and second rectifying circuit 320. Consequently, phase shifting element 313 has a capacitance of about one half of that of phase shifting element 223 described above with reference to FIG. 3, and a similar working voltage. Phase shifting element 323 has an inductance of about one half of that of phase shifting element 123 described above with reference to FIG. 1.

In first rectifying circuit 310, phase shifting element 313 may alternatively be an inductor that imposes a phase lag on the AC line current. In second rectifying circuit 320, phase shifting element 323 may alternatively be a capacitor that imposes a phase lead on the AC line current.

A filter capacitor may be located in parallel with the DC input 22 of DC-DC converter 18. A relatively small filter capacitor will principally remove switching transients and AC line glitches from the raw DC provided to DC-DC converter 18. A substantially larger filter capacitor will principally decrease the dynamic range and increase the minimum voltage of the raw DC provided to the DC-DC converter.

Figure 7:
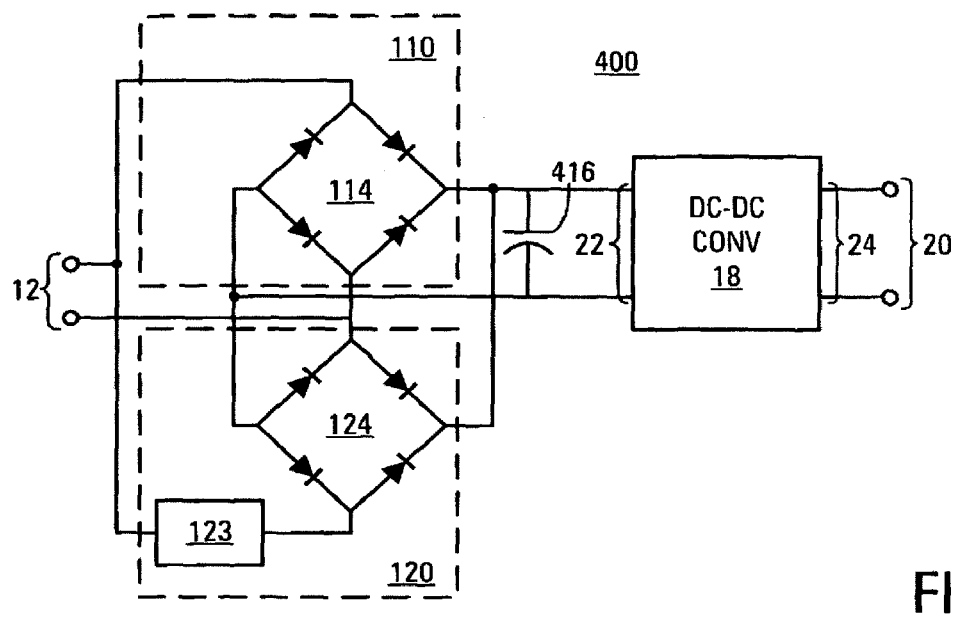
FIG. 7 is a block diagram of an example of an AC-DC power converter in accordance with a fourth embodiment of the invention.

FIG. 7 is a block diagram of an example of an AC-DC power converter 400 in accordance with a fourth embodiment of the invention. AC-DC power converter 400 is composed of AC input 12, first rectifying circuit 110, second rectifying circuit 120, a filter capacitor 416, DC-DC converter 18 and DC output 20. DC-DC converter has a DC input 22 and a DC output 24. First rectifying circuit 110 and second rectifying circuit 120 are connected in parallel between AC input 12 and the DC input 22 of DC-DC converter 18. Filter capacitor 416 is connected in parallel with DC input 22. At least one of the rectifying circuits comprises a phase shifting element providing a phase shift at the AC line frequency. In the example of this fourth embodiment shown, second rectifying circuit 120 comprises phase shifting element 123 and phase shifting element 123 is an inductor providing a phase lag.

Figure 8A:
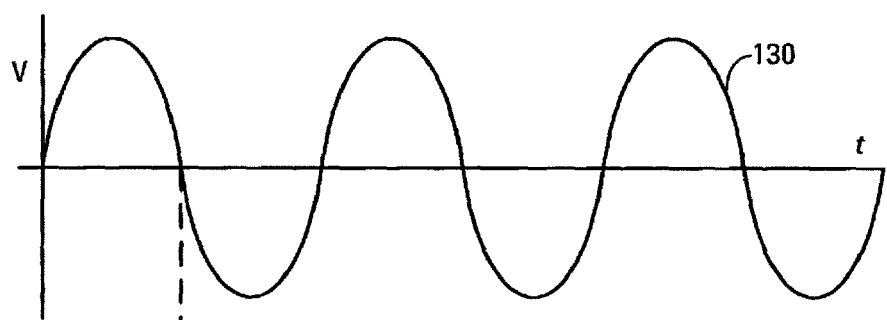
FIGS. 8A, 8B, 8C and 8D are graphs showing the waveforms of the AC line voltage, the output voltage of first rectifying circuit, the output voltage of second rectifying circuit, and the voltage across the DC input of the DC-DC converter in the example of an AC-DC power converter shown in FIG. 7.
Figure 8B:
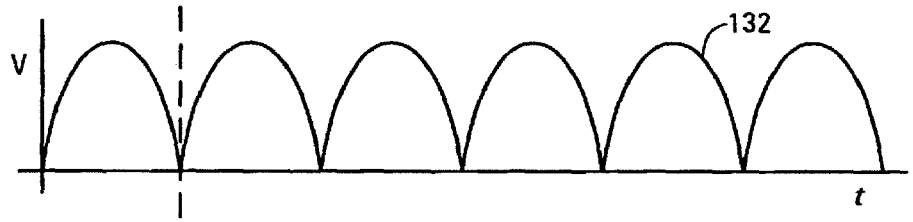
Figure 8C:
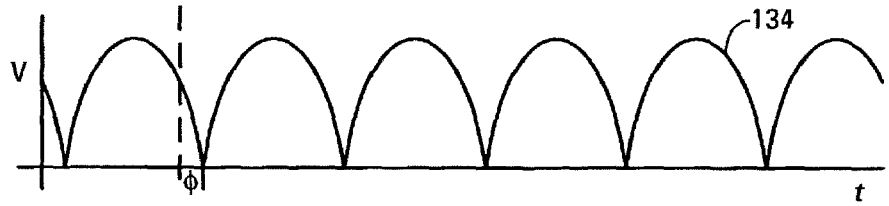

FIGS. 8A, 8B, and 8C are graphs showing the waveform 130 of the AC line voltage received at AC input 12, the waveform 132 of the output voltage of first rectifying circuit 110 and the waveform 134 of the output voltage of second rectifying circuit 120. The above description of FIGS. 2A, 2B and 2C applies to FIGS. 8A, 8B, and 8C, respectively, so FIGS. 8A, 8B, and 8C will not be individually described.

Figure 8D:
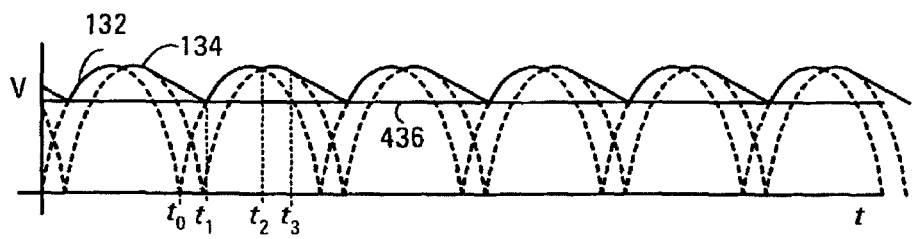

FIG. 8D is a graph showing the waveform of the voltage across the DC input 22 of DC-DC converter 18 and across filter capacitor 416. Operation of AC-DC power converter 400 will be described starting at a time $t_0$, which is one of the times at which the output voltage of first rectifying circuit 110 is zero. At time $t_0$, the output voltage of first rectifying circuit 110 and the output voltage of second rectifying circuit 120 are both less than the voltage on filter capacitor 416. Thus, filter capacitor 416 is the sole supplier of current to DC-DC converter 18: the diodes of first rectifying circuit 110 and the diodes of second rectifying circuit 120 are reverse biased. As time advances from time $t_0$, the voltage on filter capacitor 416 falls as it supplies current to DC-DC converter 18, the output voltage of first rectifying circuit 110 increases, and the output voltage of second rectifying circuit 120 falls. At time $t_1$, the output voltage of first rectifying circuit 110 becomes greater than the voltage on filter capacitor 416, and first rectifying circuit 110 takes over as the sole supplier of current to DC-DC converter 18. Additionally, first rectifying circuit 110 supplies current to filter capacitor 416, so that the voltage on the filter capacitor follows the output voltage of first rectifying circuit 110. The diodes of second rectifying circuit 120 remain reverse biased.

The output voltage of first rectifying circuit 110 continues to increase to a peak value, then begins to fall as the output voltage of second rectifying circuit 120 continues to rise. Filter capacitor also discharges as the output voltage of first rectifying circuit 110 falls. At time $t_2$, the output voltage of first rectifying circuit 110 falls below that of second rectifying circuit 120, and second rectifying circuit 120 becomes the sole supplier of current to DC-DC converter 18. Additionally, second rectifying circuit 120 supplies current to filter capacitor 416, so that the voltage on the filter capacitor follows the output voltage of second rectifying circuit 120. As time advances from time $t_2$, the output voltage of second rectifying circuit 120 falls, eventually falling faster than the voltage on filter capacitor 416. At time $t_3$, the diodes of second rectifying circuit 120 become reverse biased, second rectifying circuit 120 stops supplying current to DC-DC converter 18, and filter capacitor 416 takes over as the sole supplier of current to DC-DC converter 18. Filter capacitor 416 remains the sole supplier of current to DC-DC converter 18 until time $t_1$ of the next half cycle of the AC line voltage.

The process just described then repeats every half cycle of the AC line voltage, with the task of sole supplier of current to DC-DC converter 18 rotating in round-robin fashion among first rectifying circuit 110, second rectifying circuit 120 and filter capacitor 416 at times $t_1$, $t_2$ and $t_3$.

In FIG. 8D, solid lines are used to indicate the portion of the output voltage waveform 132 of first rectifying circuit 110, the portion of the voltage waveform 134 of second rectifying circuit 120 and the portion of the voltage waveform of filter capacitor 416 during which the respective rectifying circuit or filter capacitor is supplying current to DC-DC converter 18. Additionally, in FIG. 8D, broken lines are used to indicate the portion of the output voltage waveform 132 of first rectifying circuit 110 and the portion of the voltage waveform 134 of second rectifying circuit 120 during which the respective rectifying circuit is not supplying current to DC-DC converter 18.

FIG. 8D illustrates how the voltage across DC input 22 never falls below the minimum voltage level indicated by the line 436: second rectifying circuit 120 and filter capacitor 416 collectively provide to DC-DC converter 18 a voltage greater than minimum voltage level 436 during the time that the output voltage of first rectifying circuit 110 is below minimum voltage level 436. Additionally, first rectifying circuit 110 and filter capacitor 416 collectively provide to DC-DC converter 18 a voltage greater than minimum voltage level 436 during the time that the output voltage of second rectifying circuit 120 is below minimum voltage level 436.

Minimum voltage level 436 depends on the phase shift provided by phase shifting element 123 and the capacitance of filter capacitor 416. Phase shifting element 123 and filter capacitor 416 are specified such that minimum voltage level 436 is greater than or equal to the minimum input voltage of DC-DC converter 18 at its maximum output current. For a given minimum input voltage, phase shifting element 123 in AC-DC power converter 400 can be specified to give less phase shift than in AC-DC power converter 100 described above with reference to FIG. 1.

Many different types of DC-DC converters that provide galvanic isolation are known in the art and may be used as DC-DC converter 18. Some examples of DC-DC converters suitable for use as DC-DC converter 18 will be described next with reference to FIGS. 9-14. The examples will be described with reference to their application to AC-DC power converter 100 described above with reference to FIG. 1. The examples may equally well be applied to AC-DC power converters 200, 300 and 400 described above with reference to FIGS. 3, 5 and 7, respectively.

Figure 9:
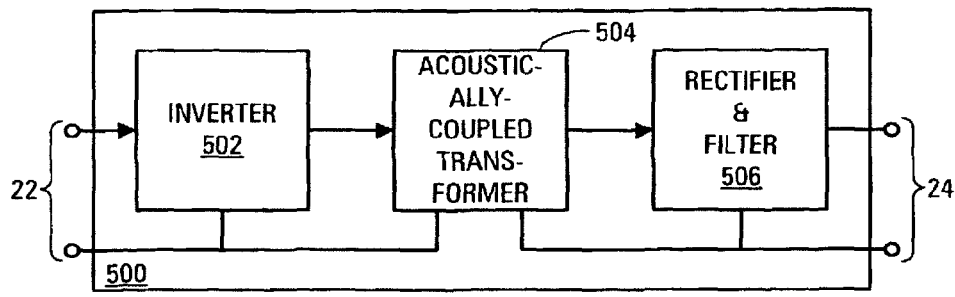
FIG. 9 is a block diagram showing an example of an open-loop DC-DC converter that can be used as the DC-DC converter in the above-described embodiments.

FIG. 9 is a block diagram showing an example 500 of an open-loop DC-DC converter that can be used as DC-DC converter 18. DC-DC converter 500 is composed of an inverter 502, an acoustically-coupled transformer 504 and a rectifier and filter circuit 506. Inverter 502 has an input connected to the DC input 22 of DC-DC converter 500 and an output connected to the primary of acoustically-coupled transformer 504. The secondary of acoustically-coupled transformer 504 is connected to the input of rectifier and filter circuit 506. The output of rectifier and filter circuit 506 is connected to DC output 24.

Inverter 502 receives the raw DC power output by first rectifying circuit 110 and second rectifying circuit 120 and generates AC power from the raw DC. The AC power is typically a sine-wave or square wave at a frequency in the order of 100 MHz. Acoustically-coupled transformer 504 passes the AC power but blocks DC and extraneous AC up to the specified breakdown voltage of AC-DC power converter 100 (FIG. 1). As noted above, the breakdown voltage is typically in the range from about 1 kV to 4 kV. Acoustically-coupled transformer 504 additionally steps the voltage of the AC power down to a voltage more similar to the rated output voltage of AC-DC power converter 100. Rectifier and filter circuit 506 rectifies the stepped-down AC power output by acoustically-coupled transformer 504 and filters the residual AC from the resulting DC power. Because the DC power output by the rectifier has a substantial AC component at twice the AC line frequency, the rectifier and filter circuit typically comprises a filter capacitor having a relatively large capacitance. However, the voltage rating of the filter capacitor is relatively low since it is on the secondary side of acoustically-coupled transformer 504, so the physical size of the capacitor need not be large. Additionally, in this open-loop embodiment, rectifier and filter circuit 506 may incorporate a DC regulator to regulate the DC voltage provided to DC output 24.

Two examples of a closed-loop DC-DC converter that can be used as DC-DC converter 18 will be described next with reference to FIGS. 10 and 11. The two examples have the same forward path but differ in their feedback circuits.

Figure 10:
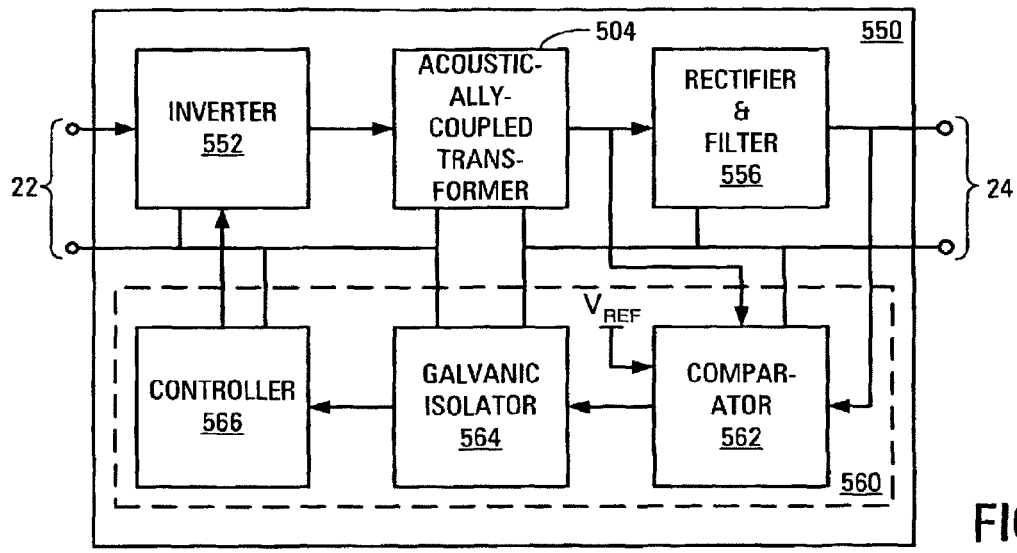
FIG. 10 is a block diagram showing a first example of a closed-loop DC-DC converter that can be used as the DC-DC converter in the above-described embodiments.

FIG. 10 shows a first example 550 of a closed-loop DC-DC converter that can be used as DC-DC converter 18. DC-DC converter 550 is composed of an inverter 552, acoustically-coupled transformer 504, a rectifier and filter circuit 556 and a feedback circuit 560 that extends between DC output 24 and a control input of inverter 552. Inverter 552, acoustically-coupled transformer 504 and rectifier and filter circuit 556 are connected between DC input 22 and DC output 24 in a manner similar to that described above with reference to inverter 502, acoustically-coupled transformer 504 and rectifier and filter circuit 506 shown in FIG. 9.

Feedback circuit 560 is composed of a comparator 562, a galvanic isolator 564 and a controller 566 connected in series. Comparator 562 receives the DC voltage across DC output 24, compares this voltage with a reference voltage $V_{REF}$ and generates an error signal representing the difference between the DC voltage and the reference voltage. The comparator passes the error signal to galvanic isolator 564. Galvanic isolator 564 passes the error signal to controller 566 but blocks DC and extraneous AC up to the specified breakdown voltage of AC-DC power converter 100 (FIG. 1). Controller 566 receives the error signal and, from the error signal, generates a control signal suitable for controlling the output of inverter 552.

The control signal output by controller 566 controls the output of inverter 552 in a manner that tends to correct the error represented by the error signal. In particular, the control signal operates to hold the DC voltage across DC output 24 constant notwithstanding the large voltage range of the raw DC power received at DC input 22. This removes most of the AC component at twice the line frequency from the DC power output by the rectifier and allows filtering to be performed by a filter capacitor having a capacitance of the order of nanofarads. Such a capacitor has is substantially smaller in physical size than the filter capacitor that constitutes part of rectifier and filter circuit 506 described above with reference to FIG. 9.

In other embodiments, controller 566 constitutes part of inverter 552, and inverter receives the error signal from galvanic isolator 564.

Galvanic isolators based on optical coupling or magnetic coupling are known in the art and may be used galvanic isolator 564. An acoustic galvanic isolator may also be used as galvanic isolator 564. For example, acoustic galvanic isolators based on film bulk acoustic resonators (FBARs) may be used, such as those disclosed by Larson et al. in U.S. patent application Ser. No. 11/253,464, entitled Acoustic Galvanic Isolator, assigned to the assignee of this disclosure and incorporated by reference.

In the example shown in FIG. 10, galvanic isolator 564 is an acoustic galvanic isolator that shares common components and operates at the same frequency as acoustically-coupled transformer 504. In this case, comparator 562 has a signal input connected to DC output 24 and a clock input connected to receive a sample of the AC power output by acoustically-coupled transformer 504. The comparator generates an error signal and modulates the clock signal with the error signal to generate an RF error signal and the same frequency as the AC power coupled by acoustically-coupled transformer 504. Acoustic galvanic isolator 564 passes the RF error signal to controller 566 but blocks DC and extraneous AC up to the specified breakdown voltage of AC-DC power converter 100 (FIG. 1). Controller 566 receives the RF error signal, demodulates the error signal from the RF error signal and generates from the error signal a control signal suitable for controlling the output of inverter 552 as described above. Alternatively, controller may provide the error signal itself to the inverter as the control signal. The controller may constitute part of inverter 552, in which case inverter 552 receives the RF error signal from acoustic galvanic isolator 564. Other types of galvanic isolators capable of operating at RF may be used as element 564 in DC-DC converter 550.

Figure 11:
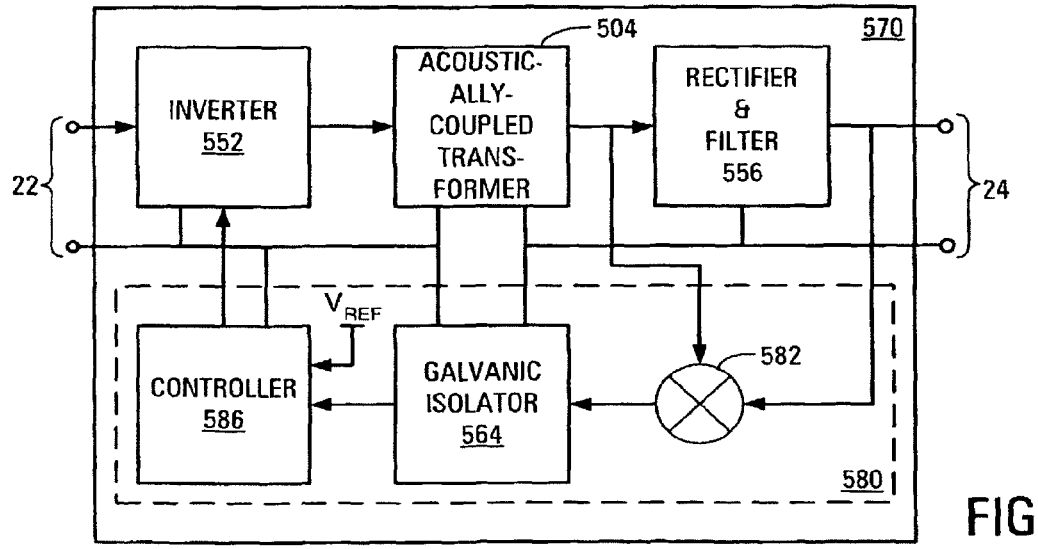
FIG. 11 is a block diagram showing a second example of a closed-loop DC-DC converter that can be used as the DC-DC converter in the above-described embodiments.

FIG. 11 shows a second example 570 of a closed-loop DC-DC converter that can be used as DC-DC converter 18. DC-DC converter 570 is composed of inverter 552, acoustically-coupled transformer 504, rectifier and filter circuit 556 and a feedback circuit 580 that extends between DC output 24 and the control input of inverter 552. Inverter 552, acoustically-coupled transformer 504, rectifier and filter circuit 556 and feedback circuit 580 are interconnected in a manner similar to that described above with reference to inverter 552, acoustically-coupled transformer 504 rectifier and filter circuit 556 and feedback circuit 560 shown in FIG. 10.

Feedback circuit 580 is composed of a modulator 582, galvanic isolator 564 and a controller 586 connected in series. Modulator 582 receives the DC voltage output by first rectifying circuit 556 and a sample of the AC voltage output by acoustically-coupled transformer 504 to generate an RF voltage signal representing the DC voltage output by DC-DC converter 570. The modulator passes the RF voltage signal to galvanic isolator 564. Galvanic isolator 564 passes the RF voltage signal to controller 566 but blocks DC and extraneous AC up to the specified breakdown voltage of AC-DC power converter 100 (FIG. 1). Controller 586 receives the RF voltage signal and demodulates the RF voltage signal to recover the voltage signal representing the DC voltage output by DC-DC converter 570. Controller 586 compares the voltage signal with a reference voltage $V_{REF}$ to generate an error signal that it feeds to the control input of inverter 562. The error signal controls the output of inverter 552 in a manner that tends to correct the error represented by the error signal, as described above. In an embodiment, galvanic isolator 564 is an acoustic galvanic isolator.

Figure 12:
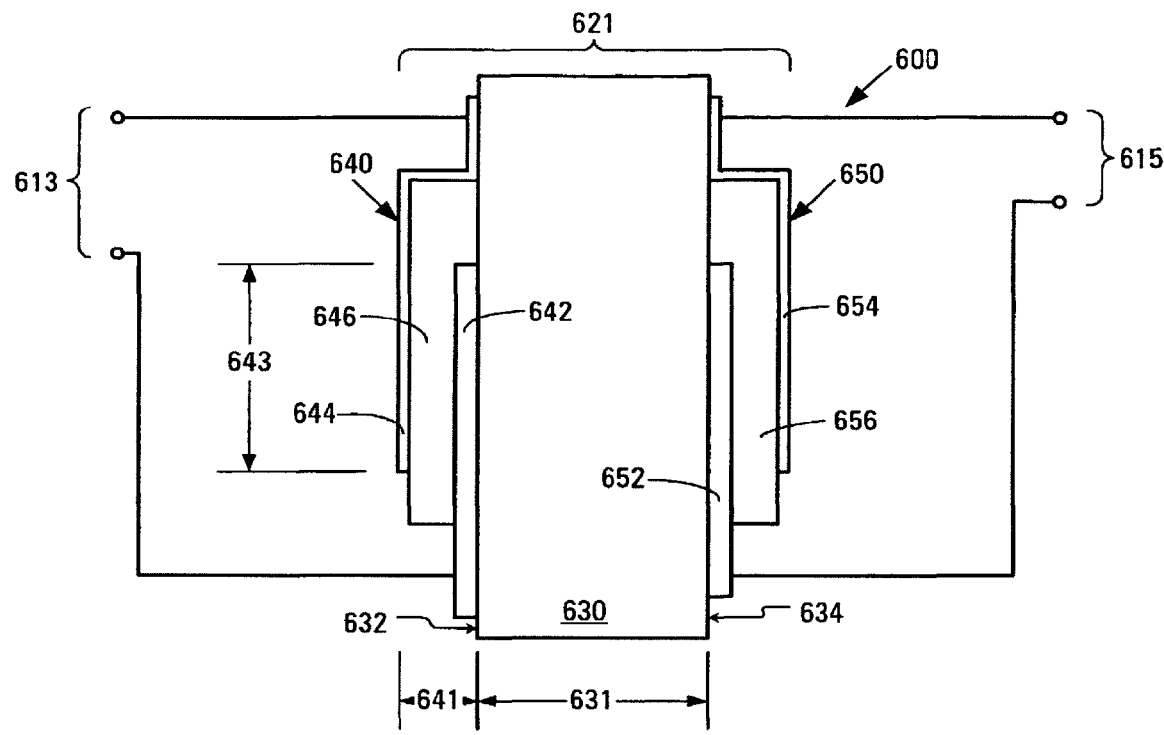
FIG. 12 is a schematic diagram showing an example of an acoustically-coupled transformer that may be used in the DC-DC converter embodiments shown in FIGS. 9, 10 and 11.

FIG. 12 is a schematic diagram showing an example of an acoustically-coupled transformer 600 that may be used as acoustically-coupled transformer 504 in the exemplary embodiments of DC-DC converter 18 shown in FIGS. 9, 10 and 11. Acoustically-coupled transformer 600 is implemented as a resonant structure 621 having at least one mechanical resonance in an operating frequency range. In typical embodiments, the center frequency of the operating frequency range is in the frequency range from about 20 MHz to about 500 MHz. A typical center frequency of the operating frequency range is about 150 MHz. The frequency of the AC power output by inverter 552 is nominally equal to the center frequency.

Resonant structure 621 is composed of an insulating substrate 630, a first electro-acoustic transducer 640 and a second electro-acoustic transducer 650. Substrate 630 has a first major surface 632 and a second major surface 634 opposite first major surface 632. First electro-acoustic transducer 640 is mechanically coupled to the first major surface 632 of the substrate 630. Second electro-acoustic transducer 650 is mechanically coupled to the second major surface 634 of substrate 630.

Examples of the material of insulating substrate 630 include alumina, glass, ceramic, sapphire and one or more other electrically-insulating materials having a high resistivity and a high electrical breakdown field. In other embodiments, insulating substrate 630 is composed of one or more layers of an at least partially electrically-conducting material, such as silicon, and one or more layers of electrically-insulating material having a high resistivity and a high electrical breakdown field. Insulating substrate 630 electrically isolates first electro-acoustic transducer 640 from second electro-acoustic transducer 650 at voltages up to the specified breakdown voltage of AC-DC power converter 100 (FIG. 1).

Electro-acoustic transducers 640 and 650 are located on the opposed major surfaces of substrate 630. Each of the transducers 640 and 650 is operable to convert input AC electrical power to acoustic energy and to convert acoustic energy to output AC electrical power.

Resonant structure 621, including substrate 630 and electro-acoustic transducers 640 and 650, is structured to resonate mechanically at least one resonant frequency in the operating frequency range of acoustically-coupled transformer 600. Typically, resonant structure 621 has more than one resonant frequency in the operating frequency range, as will be described in more detail with reference to FIG. 13.

In the embodiment of acoustically-coupled transformer 600 shown, first electro-acoustic transducer 640 has a first electrode 642 located adjacent substrate 630, a second electrode 644 opposite first electrode 642, and a piezoelectric element 646 between first electrode 642 and second electrode 644. Examples of the material of electrodes 642 and 644 include gold (Au), platinum (Pt), iridium (Ir), ruthenium (Ru), palladium (Pd), and one or more other electrically-conducting materials. Electrodes 642 and 644 are electrically connected to AC input terminals 613 of the acoustically-coupled transformer 600. Examples of the material of piezoelectric element 646 include lead zirconium titanate Pb(Zr,Ti)O$_3$ (PZT), barium titanate (BaTiO$_3$), potassium niobate (KNbO$_3$) and any other piezoelectric material having high electro-acoustic coupling and a high dielectric constant. The dimensions and total mass of first electro-acoustic transducer 640, for example its thickness 641, depend on factors such as the operating frequency.

Second electro-acoustic transducer 650 has a first electrode 652 adjacent substrate 630, a second electrode 654 opposite first electrode 652, and a piezoelectric element 656 between first electrode 652 and second electrode 654. Examples of the material of electrodes 652 and 654 include gold (Au), platinum (Pt), iridium (Ir), ruthenium (Ru), palladium (Pd), and one or more other electrically-conducting materials. Electrodes 652 and 654 are electrically connected to the AC output terminals 615 of acoustically-coupled transformer 600. Examples of the material of piezoelectric element 656 include lead zirconium titanate Pb(Zr,Ti)O$_3$ (PZT), barium titanate (BaTiO$_3$), potassium niobate (KNbO$_3$) and any other piezoelectric material having high electro-acoustic coupling and a high dielectric constant. The dimensions and total mass of second electro-acoustic transducer 650, for example its thickness, depend on factors such as the operating frequency.

First electro-acoustic transducer 640 and second electro-acoustic transducer 650 are typically structured to have a mechanical resonance at a frequency nominally equal to the operating frequency. However, as will be described in more detail below with reference to FIG. 13, the mechanical resonances of the electro-acoustic transducers are substantially lower in Q than the resonances of resonant structure 621. Specifically, the thickness 641 of first electro-acoustic transducer 640 is an integral multiple of one-half the wavelength in the electro-acoustic transducer of an acoustic wave nominally equal in frequency to the operating frequency. Since piezoelectric element 644 accounts for most, but not all, of the thickness 641 of first electro-acoustic transducer 640, the thickness 641 can be approximated as follows. The speed of sound in PZT is approximately 4,500 meters per second. At an operating frequency of 150 MHz, the wavelength of an acoustic wave in the piezoelectric element 646 of first electro-acoustic transducer 640 is approximately 30 micrometers (μm), calculated as follows:

$$(4.5\times10^3 \text{ m·s}^{-1})/(1.5\times10^8 \text{ s}^{-1})$$

To achieve an overall thickness 641 that is an integral multiple of one-half of the wavelength in first electro-acoustic transducer 640 of an acoustic wave nominally equal in frequency to the operating frequency, the first electro-acoustic transducer is fabricated with piezoelectric element 646 having a thickness of, for example, somewhat less than 15 μm. Typically, the overall thickness 641 of first electro-acoustic transducer 640 is, for example, approximately 15 μm to 40 μm. Lateral dimensions 643 of first electro-acoustic transducer 640 are in the range from a few hundred micrometers to a few thousand micrometers, for example, 300 μm to 3,000 μm. Second electro-acoustic transducer 650 is similar in dimensions.

Inverter 552 (FIGS. 10 and 11) supplies AC electrical power to AC input terminals 613. First electro-acoustic transducer 640 converts the AC power to acoustic energy, i.e., mechanical vibrations. The acoustic energy causes resonant structure 621 to vibrate mechanically at the operating frequency. The frequency of the AC power is at or near the frequency of one of the resonances of resonant structure 621. While substrate 630, first electro-acoustic transducer 640, and second electro-acoustic transducer 650 collectively determine the resonant frequencies of resonant structure 621, the resonant frequencies are primarily determined by the thickness of substrate 630 and the speed of sound in the material of the substrate. Accordingly, the thickness and material of substrate 630 primarily determine the frequencies of the mechanical resonances of resonant structure 621.

The operating frequency range of inverter 552 (FIGS. 10 and 11) is chosen to encompass one of the resonant frequencies of resonant structure 621. The operating frequency range is chosen so that it includes an operating frequency at which the thickness 631 of substrate 630 is an integral multiple of one-half of the wavelength in the substrate of an acoustic wave nominally equal in frequency to the operating frequency. For example, the speed of sound in alumina is approximately 11,000 meters per second. At an operating frequency of 150 MHz, the wavelength in substrate 630 of an acoustic wave having a frequency nominally equal to the operating frequency is approximately 73 μm, calculated as follows:

$$(11 \times 10^3 \text{ m·s}^{-1})/(1.5 \times 10^8 \text{ s}^{-1})$$

Accordingly, in an exemplary embodiment, substrate 630 has a thickness 31 that is an integral multiple of (73/2) μm, e.g., 290 μm, corresponding to eight half wavelengths. Typically, substrate 630 has a thickness 631 in the order of one hundred micrometers.

The acoustic energy generated by first electro-acoustic transducer 640 is coupled to substrate 630 and causes resonant structure 621 to resonate, i.e., to vibrate mechanically. Continued application of AC power to first electro-acoustic transducer 640 causes resonant structure 621 to accumulate acoustic energy. The mechanical vibration of resonant structure 621 is coupled to second electro-acoustic transducer 650. Second electro-acoustic transducer 650 absorbs acoustic energy from resonant structure 621, converts the acoustic energy to electrical energy, and delivers the electrical energy to output terminals 615 as output AC power.

Figure 13:
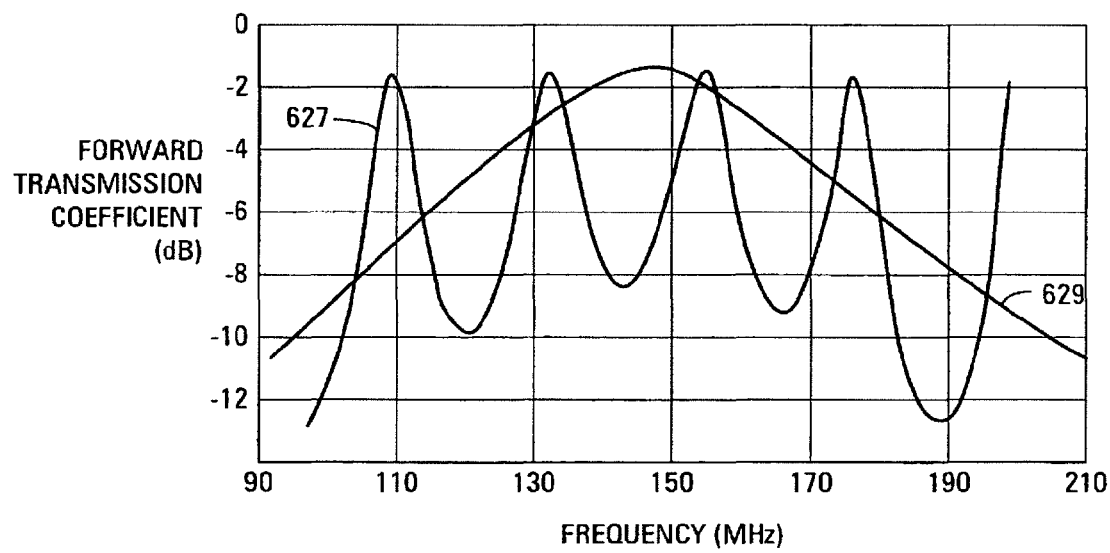
FIG. 13 is a graph showing the frequency response of the calculated forward transmission coefficient of a typical embodiment of the acoustically-coupled transformer shown in FIG. 12 and the frequency response of the calculated forward transmission coefficient of one of its electro-acoustic transducers over the frequency range from 90 MHz to 210 MHz.

The output AC power generated by acoustically-coupled transformer 600 depends on various factors including the frequency of the input AC power relative to the resonant frequency of resonant mechanical structure 621. FIG. 13 is a graph that includes a curve 627 that shows the frequency response of the calculated forward transmission coefficient of a typical embodiment of acoustically-coupled transformer 600 over an exemplary frequency range from 90 MHz to 210 MHz. The forward transmission coefficient of acoustically-coupled transformer 600 is the ratio of the output AC power output by second electro-acoustic transducer 650 to the input AC power applied to first electro-acoustic transducer 640. In calculating the calculated forward transmission coefficient of acoustically-coupled transformer 600, the forward transmission coefficients of the first and second electro-acoustic transducers 640 and 650 were assumed to remain constant over the indicated frequency range to enable FIG. 13 to show the frequency response of resonant mechanical structure 621. Due to the multiple mechanical resonances of resonant mechanical structure 621, the forward transmission coefficient is greater at certain operating frequencies, such as 155 MHz, than at other operating frequencies, such as 144 MHz. The forward transmission coefficient has a peak at the resonant frequencies of resonant mechanical structure 621. Because the forward transmission coefficient has peaks at multiple frequencies, acoustically-coupled transformer 600 is said to have multi-mode operating characteristic.

FIG. 13 also includes a curve 629 that shows the frequency response of the calculated forward transmission coefficient of a typical embodiment of first electro-acoustic transducer 640. The forward transmission characteristic of second electro-acoustic transducer 650 has a similar frequency response. The calculated forward transmission coefficient of first electro-acoustic transducer 640 is the ratio of the acoustic power generated by first electro-acoustic transducer 640 to the input AC electrical power applied to first electro-acoustic transducer 640. The frequency response of the forward transmission coefficient of first electro-acoustic transducer 640 is typical of a resonant device having a Q substantially lower than the Q of the resonances of resonant mechanical structure 621. This allows the operating frequency to be varied over a frequency range, e.g., from 144 MHz to 155 MHz, that causes a substantial change in the forward transmission coefficient of acoustically-coupled transformer 600 but that causes little variation in the forward transmission coefficients of electro-acoustic transducers 640 and 650.

FIG. 13 shows how the AC power coupled from input terminals 613 to output terminals 615 may be changed substantially by changing the operating frequency of acoustically-coupled transformer 600. The operating frequency of acoustically-coupled transformer 600 is changed by changing the operating frequency of inverter 552 (FIGS. 10 and 11). In portions of the waveform on DC input 22 at which the applied voltage is high (see FIG. 2D) and/or when current drawn from DC output 24 is low, the operating frequency corresponds to a low forward transmission coefficient, and in portions of the waveform on DC input 22 at which the applied voltage is low and/or when current drawn from DC output 24 is high, the operating frequency corresponds to a high forward transmission coefficient to maintain the voltage at DC output 24 constant.

Acoustically-coupled transformer 600 is described in much more detail, including practical embodiments and fabrication techniques, by John D. Larson III et al. in U.S. patent application Ser. No. 10/971,169 assigned to the assignee of this disclosure and incorporated by reference.

Figure 14:
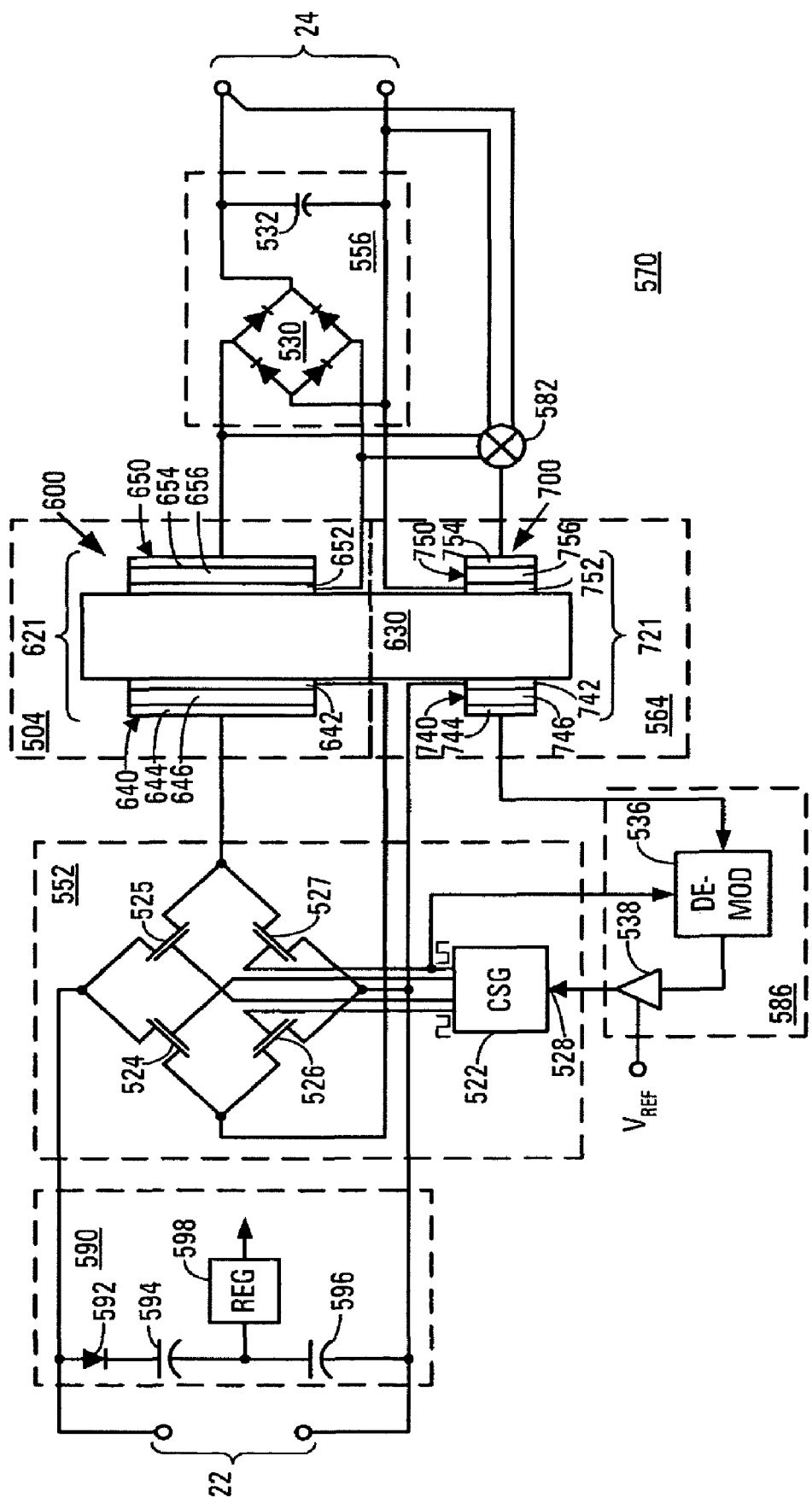
FIG. 14 is a schematic diagram of an exemplary embodiment of the DC-DC converter shown in FIG. 11 and incorporating an embodiment of the acoustically-coupled transformer shown in FIG. 13.

FIG. 14 is a schematic diagram of an exemplary embodiment of DC-DC converter 570 described above with reference to FIG. 11 and incorporating an embodiment of acoustically-coupled transformer 600 described above with reference to FIGS. 12 and 13. The various blocks of DC-DC converter 570 described above with reference to FIG. 11 are shown enclosed by broken lines.

DC-DC converter 570 receives the raw DC power output by first rectifying circuit 110 and second rectifying circuit 120 at its DC input 22. In DC-DC converter 570, inverter 552 is composed of a variable-frequency clock signal generator 522 and switching transistors 524, 525, 526 and 527. Switching transistors 524, 525, 526 and 527 are connected as a bridge circuit between DC input 22 and the electrodes 642 and 644 of electro-acoustic transducer 640 that forms part of acoustically-coupled transformer 600. Specifically, switching transistor 524 is connected between one terminal of DC input 22 and electrode 642, switching transistor 525 is connected between the one terminal of DC input 22 and electrode 644, switching transistor 526 is connected between the other terminal of DC input 22 and electrode 642 and switching transistor 527 is connected between the other terminal of DC input 22 and electrode 644.

Acoustically-coupled transformer 600 presents a substantially capacitative load. The bridge configuration of switching transistors 524, 525, 526 and 527 allows the raw DC at DC input 22 both to drive electrical charge into, and to remove electrical charge from, first electro-acoustic transducer 640.

Clock signal generator 522 generates a clock signal in the operating frequency range of acoustically-coupled transformer 600. In one embodiment the operating frequency range extends from about 144 MHz to about 155 MHz. Other frequency ranges are possible. Clock signal generator incorporates driver circuits (not shown) that generate antiphase drive signals suitable for driving switching transistors 524, 525, 526 and 527. The gates of switching transistors 524, 525, 526 and 527 are connected to receive respective drive signals clock signal generator 522. The drive signals received by switching transistors 524 and 527 are in antiphase with the drive signals received by switching transistors 525 and 526. In response to clock signal generator 522, switching transistors 524, 525, 526 and 527 alternate the sense in which electro-acoustic transducer 640 is connected to DC input 22 at the frequency of clock signal generator 522, i.e., at about 150 MHz.

Acoustically-coupled transformer 504 is embodied as acoustically-coupled transformer 600 substantially as described above with reference to FIG. 12. However, an additional acoustically-coupled transformer 700 shares substrate 630 with acoustically-coupled transformer 600. Acoustically-coupled transformer 700 provides galvanic isolator 564 and will be described in detail below.

Rectifier and filter circuit 556 is composed of bridge rectifier 530 and filter capacitor 532. The inputs of bridge rectifier 530 are connected to the electrodes 652 and 654 of second electro-acoustic transducer 650. The outputs of bridge rectifier 530 are connected to DC output 24. Filter capacitor 532 is connected in parallel with DC output 24. As noted above, the high operational frequency of acoustically-coupled transformer 504 allows filter capacitor 532 to have a low capacitance, typically of the order of nanofarads. Low-voltage capacitors of this capacitance are physically small.

DC output 24 is connected to the information signal input of modulator 582. Electrodes 652 and 654 of second electro-acoustic transducer 650 are connected to the carrier signal input of modulator 582. Modulator 582 modulates the carrier signal provided by electro-acoustic transducer 650 in accordance with the DC voltage across DC output 24 to generate an RF voltage signal that the modulator applies between the electrodes 752 and 754 of the second electro-acoustic transducer 750 of acoustically-coupled transformer 700. Any suitable analog or digital modulation scheme compatible with the properties of the transmission path through acoustically-coupled transformer 700 may be used. For example, an FM modulation scheme, in which the frequency of the carrier signal is modulated in accordance with the DC voltage on DC output 24, may be used. Alternatively, the DC voltage across DC output 24 may be digitized by an analog-to-digital converter. The amplitude of the carrier signal is then modulated using the output of the analog-to-digital converter.

Acoustically-coupled transformer 700 is similar in structure to acoustically-coupled transformer 600 and shares substrate 630 with acoustically-coupled transformer 600. Acoustically-coupled transformer 700 is composed of a first electro-acoustic transducer 740 and a second electro-acoustic transducer 750 located opposite one another on the opposed major surfaces of substrate 630 on the same sides of insulating substrate 630 as first electro-acoustic transducer 640 and second electro-acoustic transducer 650, respectively. Electro-acoustic transducer 740, electro-acoustic transducer 750 and substrate 630 collectively constitute a resonant structure 721 that has a frequency response similar to that of resonant structure 621 described above with reference to FIG. 12. This provides acoustically-coupled transformer 700 with a frequency response similar to that of acoustically-coupled transformer 600. However, since acoustically-coupled transformer 700 couples low-power signals, electro-acoustic transducers 740 and 750 can be substantially smaller in area than the electro-acoustic transducers of acoustically-coupled transformer 600.

First electro-acoustic transducer 740 is composed of a first electrode 742 adjacent substrate 630, a second electrode 744 opposite first electrode 742, and a piezoelectric element 746 between electrodes 742 and 744. Second electro-acoustic transducer 750 is composed of a first electrode 752 adjacent substrate 630, a second electrode 754 opposite first electrode 752 and a piezoelectric element 756 between electrodes 752 and 754. First electro-acoustic transducer 740 and first electro-acoustic transducer 640 are typically fabricated on the same major surface of substrate 630 by common process steps. Second electro-acoustic transducer 750 and second electro-acoustic transducer 650 are typically fabricated on the same major surface of substrate 630 by common process steps. Consequently, the incremental cost of providing acoustically-coupled transformer 700 is very small.

Acoustically-coupled transformer 700 couples the RF voltage signal from modulator 582 to controller 586 but blocks DC and extraneous AC at voltages up to the specified breakdown voltage of AC-DC power converter 100 (FIG. 1).

Controller 586 is composed of demodulator 536 and comparator 538. The signal input of demodulator 536 is connected to second electrode 744 of first electro-acoustic transducer 740. First electrode 742 is connected to one of the terminals of DC input 22. The clock input of demodulator 536 is connected to one of the outputs of clock signal generator 522. The output of demodulator 536 is connected to one input of comparator 538. The other input of comparator 538 is connected to reference voltage $V_{REF}$. The output of comparator 538 is connected to the frequency control input 528 of variable-frequency clock signal generator 522.

In controller 586, demodulator 536 demodulates the RF voltage signal output by acoustically-coupled transformer 700 to recover the voltage signal that represents the DC voltage across DC output 24. Comparator 538 receives the voltage signal from demodulator 536 and compares the voltage signal with the voltage reference signal $V_{REF}$ to generate an error signal Comparator 538 feeds the error signal to the control input 528 of variable-frequency clock signal generator 522. The error signal controls the frequency of variable-frequency clock signal generator 522 in a sense that reduces the error signal to zero. In an example in which the operating frequency range of clock signal generator 522 is from 144 MHz to 155 MHz, and acoustically-coupled transformer 600 has the frequency response shown in FIG. 13, a value of the error signal that indicates that the DC voltage across DC output 24 is high reduces the frequency of clock signal generator 522, and a value of the error signal that indicates that the DC voltage is low increases the frequency of clock signal generator 522.

In other embodiments, the error signal modifies the duty cycle of switching transistors 524-527 in addition to or instead of changing the frequency of variable-frequency clock signal generator 522.

DC-DC converter 570 additionally includes a line-side power supply that provides a low-voltage, low-current DC power supply for clock signal generator 522 and controller 586. In the example shown, a capacitive divider composed of diode 592, small capacitance capacitor 594 and large-capacitance capacitor 594 in series is used to divide down and filter the high voltage of the raw DC voltage received at DC input 22. The capacitive divider reduces the voltage received at DC input 22 to a few volts suitable for feeding regulator 598 without dissipating significant power. Other ways may be used to power the AC line-side circuitry. Modulator 582 is powered directly from DC output 24.

Figure 15:
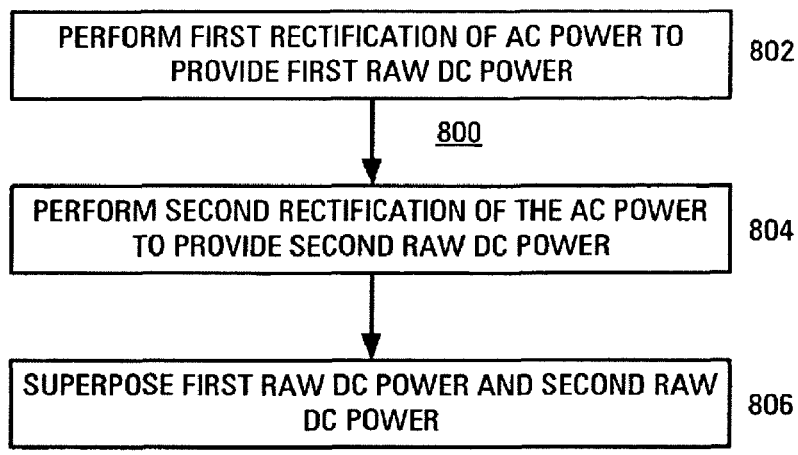
FIG. 15 is a flow chart showing an example of a first AC-DC power conversion method in accordance with an embodiment of the invention.

FIG. 15 is a flow chart showing an example of a first AC-DC power conversion method 800 in accordance with an embodiment of the invention. In block 802, a first rectification of AC power is performed to provide first raw DC power. In block 804, a second rectification of the AC power is performed to provide second raw DC power. In block 806, the first raw DC power and the second raw DC power are superposed.

Figure 16:
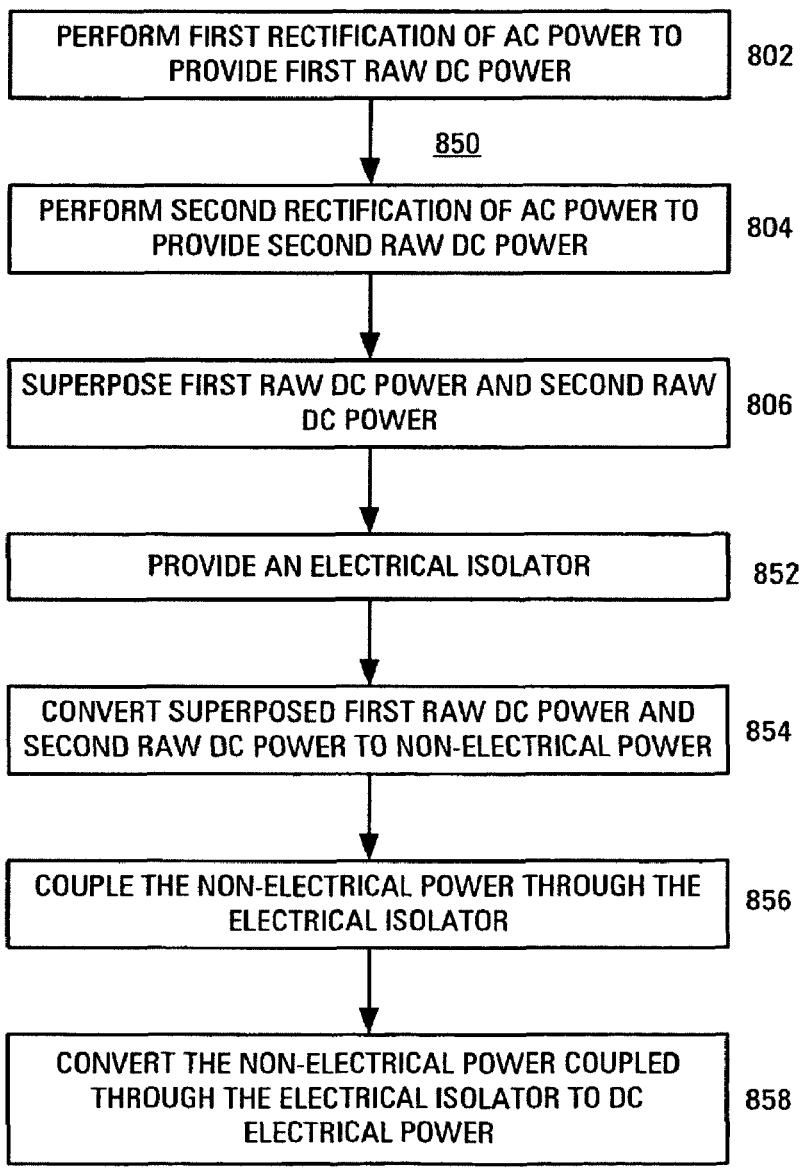
FIG. 16 is a flow chart showing an example of a second AC-DC power conversion method in accordance with an embodiment of the invention.

FIG. 16 is a flow chart showing an example of a second AC-DC power conversion method 850 in accordance with an embodiment of the invention. Blocks, 802, 804 and 806 are described above. In block 852, an electrical isolator is provided. In block 854, the superposed first raw DC power and second raw DC power are converted to non-electrical power.

In block 856, the non-electrical power is coupled through the electrical isolator. In block 858, the non-electrical power coupled through the electrical isolator is converted to DC electrical power.

In an embodiment, the superposed first raw DC power and the second raw DC power are converted to the non-electrical power in a manner that maintains the voltage of the DC electrical power constant.

This disclosure describes the invention in detail using illustrative embodiments. However, the invention defined by the appended claims is not limited to the precise embodiments described.

I claim:

1. An AC-DC power conversion method, comprising:

performing a first rectification of AC power to provide first raw DC power;

performing a second rectification of AC power to provide second raw DC power differing in phase from the first raw DC power; and superposing the first raw DC power and the second raw DC power;

providing an electrical isolator;

converting the superposed first raw DC power and the second raw DC power to non-electrical power;

coupling the non-electrical power through the electrical isolator;

converting the non-electrical power coupled through the electrical isolator to DC electrical power having a DC voltage; and performing the converting the superposed first raw DC power and the second raw DC power to non-electrical power in a manner that maintains the DC voltage constant.

* * * * *